(12) United States Patent
Kritchman et al.

(10) Patent No.: US 8,038,427 B2
(45) Date of Patent: Oct. 18, 2011

(54) RAPID PROTOTYPING APPARATUS

(75) Inventors: Eliahu M. Kritchman, Tel-Aviv (IL); Moshe Levi, Tel-Aviv (IL)

(73) Assignee: Objet Geometries Ltd., Rechovot (IL)

( * ) Notice: Subject to any disclaimer, the term of this patent is extended or adjusted under 35 U.S.C. 154(b) by 0 days.

(21) Appl. No.: 12/372,747

(22) Filed: Feb. 18, 2009

(65) Prior Publication Data
US 2009/0148621 A1 Jun. 11, 2009

Related U.S. Application Data

(62) Division of application No. 10/555,087, filed as application No. PCT/IL2004/000368 on May 2, 2004, now Pat. No. 7,500,846.

(60) Provisional application No. 60/466,731, filed on May 1, 2003.

(51) Int. Cl.
*B29C 35/08* (2006.01)
*B29C 67/00* (2006.01)
*B28B 1/16* (2006.01)
*G06F 19/00* (2006.01)

(52) U.S. Cl. .......... 425/174.4; 425/375; 700/119; 264/308; 264/401

(58) Field of Classification Search .......... 425/375, 425/174.4; 264/113, 308, 401; 700/119
See application file for complete search history.

(56) References Cited

U.S. PATENT DOCUMENTS

| | | | |
|---|---|---|---|
| 4,575,330 A | 3/1986 | Hull | |
| 4,779,108 A * | 10/1988 | Inoue | 347/238 |
| 5,031,120 A | 7/1991 | Pomerantz et al. | |
| 5,387,380 A | 2/1995 | Cima et al. | |
| 5,902,537 A | 5/1999 | Almquist et al. | |
| 6,126,884 A | 10/2000 | Kerekes et al. | |
| 6,189,999 B1 | 2/2001 | Pham et al. | |
| 6,259,962 B1 | 7/2001 | Gothait | |
| 6,330,017 B1 * | 12/2001 | Suzuki | 347/238 |
| 6,492,651 B2 | 12/2002 | Kerekes | |
| 6,569,373 B2 | 5/2003 | Napadensky | |
| 6,658,314 B1 | 12/2003 | Gothait | |
| 6,806,963 B1 * | 10/2004 | Walti et al. | 356/497 |

(Continued)

FOREIGN PATENT DOCUMENTS

EP 0963824 12/1999

(Continued)

OTHER PUBLICATIONS

International Preliminary Report on Patentability Dated Nov. 17, 2005 From the International Bureau of WIPO Re.: Application No. PCT/IL2004/000368.

(Continued)

*Primary Examiner* — Maria Veronica Ewald

(57) ABSTRACT

Apparatus for producing an object by sequentially forming thin layers of a construction material one on top of the other responsive to data defining the object, the apparatus comprising: a plurality of printing heads each having a surface formed with a plurality of output orifices and controllable to dispense the construction material through each orifice independently of the other orifices; a shuttle to which the printing heads are mounted; a support surface; and a controller adapted to control the shuttle to move back and forth over the support surface and as the shuttle moves to control the printing heads to dispense the construction material through each of their respective orifices responsive to the data to form a first layer on the support surface and thereafter, sequentially the other layers; wherein each printing head is dismountable from the shuttle and replaceable independently of the other printing heads.

40 Claims, 26 Drawing Sheets

U.S. PATENT DOCUMENTS

| | | | |
|---|---|---|---|
| 6,989,115 | B2 | 1/2006 | Russell et al. |
| 7,175,712 | B2 * | 2/2007 | Siegel .......................... 118/620 |
| 2002/0008335 | A1 | 1/2002 | Leyden et al. |
| 2002/0079601 | A1 | 6/2002 | Russell et al. |
| 2002/0167097 | A1 * | 11/2002 | Foreman et al. ............. 264/1.36 |
| 2003/0028278 | A1 | 2/2003 | Darrah et al. |
| 2003/0151167 | A1 | 8/2003 | Kritchman et al. |
| 2003/0209836 | A1 * | 11/2003 | Sherwood ..................... 264/401 |
| 2004/0207124 | A1 | 10/2004 | Kritchman et al. |
| 2005/0104241 | A1 | 5/2005 | Kritchman et al. |
| 2005/0264603 | A1 | 12/2005 | Takagi |
| 2006/0121208 | A1 * | 6/2006 | Siegel ........................... 427/487 |
| 2007/0179656 | A1 | 8/2007 | Esched et al. |
| 2009/0145357 | A1 | 6/2009 | Kritchman et al. |
| 2009/0210084 | A1 | 8/2009 | Eshed et al. |

FOREIGN PATENT DOCUMENTS

| | | |
|---|---|---|
| WO | WO 2004/096527 | 11/2004 |

OTHER PUBLICATIONS

Official Action Dated Feb. 2, 2010 From the US Patent and Trademark Office Re.: U.S. Appl. No. 12/372,748.

Official Action Dated May 16, 2008 From the US Patent and Trademark Office Re.: U.S. Appl. No. 10/555,087.

Z Corporation "Z™ 406 3D Color Printer User Manual", Revision C, User's Manual for Z406 System, Part No. 09504, p. 1-49, Apr. 19, 2002.

International Search Report and the Written Opinion Dated Jan. 11, 2005 From the International Searching Authority Re.: Application No. PCT/IL2004/000368.

Official Action Dated Mar. 29, 2010 From the US Patent and Trademark Office Re.: U.S. Appl. No. 12/372,748.

Response Dated Mar. 2, 2010 to Official Action of Feb. 2, 2010 From the US Patent and Trademark Office Re.: U.S. Appl. No. 12/372,748.

Official Action Dated Mar. 17, 2010 From the US Patent and Trademark Office Re.: U.S. Appl. No. 12/219,533.

Response Dated Aug. 24, 2010 to Official Action of Mar. 29, 2010 From the US Patent and Trademark Office Re.: U.S. Appl. No. 12/372,748.

Response Dated Mar. 31, 2011 to Office Action Dated Dec. 13, 2010 From the State Intellectual Property Office of the People's Republic of China Re. Application No. 200810171073.1.

Translation of Office Action Dated Dec. 13, 2010 From the State Intellectual Property Office of the People's Republic of China Re. Application No. 200810171073.1.

Translation of Office Action Dated Nov. 17, 2010 From the State Intellectual Property Office of the People's Republic of China Re. Application No. 200810171072.7.

Notice of Allowance Dated Oct. 22, 2010 From the US Patent and Trademark Office Re.: U.S. Appl. No. 12/372,748.

Supplemental Notice of Allowability Dated Jan. 13, 2011 From the US Patent and Trademark Office Re.: U.S. Appl. No. 12/372,748.

Response Dated Mar. 9, 2011 to Office Action of Nov. 17, 2010 From the State Intellectual Property Office of the People's Republic of China Re. Application No. 200810171072.7.

Translation of Office Action Dated Jun. 29, 2011 From the State Intellectual Property Office of the People's Republic of China Re. Application No. 200810171072.7.

Response Dated Aug. 24, 2011 to Office Action of Jun. 29, 2011 From the State Intellectual Property Office of the People's Republic of China Re. Application No. 200810171072.7.

* cited by examiner

RAPID PROTOTYPING APPARATUS

RELATED APPLICATIONS

This Application is a Divisional of U.S. patent application Ser. No. 10/555,087, filed on Aug. 22, 2006, which is a U.S. National Phase of PCT Application No. PCT/IL2004/000368, filed on May 2, 2004 which claims the benefit of U.S. Provisional Application 60/466,731 filed on May 1, 2003, the disclosure of which is incorporated herein by reference.

FIELD OF THE INVENTION

The present invention relates to apparatus, hereinafter "rapid production apparatus", for producing a 3-dimensional object by sequentially forming thin layers of material one on top of the other, responsive to data defining the object.

BACKGROUND OF THE INVENTION

Rapid production apparatus (RPAs) form objects by sequentially forming thin layers, hereinafter "construction layers", of a material one on top of the other responsive to data, hereinafter "construction data", defining the objects. There are numerous and varied types of RPAs and different methods by which they form the thin construction layers they use to build an object.

One type of RPA, conventionally referred to as an "ink-jet RPA", "prints" each layer of an object it builds. To form a given layer the ink-jet RPA controls at least one dispenser, referred to as a "printing head", to dispense at least one construction material in liquid form in a pattern responsive to construction data for the object and then solidifies the dispensed material. At least one construction material, hereinafter a "building material" (BM), dispensed to form the layer is printed in the shape of a cross section of the object. Building material in adjacent construction layers is printed in the shape of thin cross sections of the object that are displaced relative to each other by a small incremental distance along a same direction, hereinafter referred to as a "stacking direction", relative to the object.

For convenience of exposition, the cross sections of the object in whose shapes the construction layers are formed are assumed to be parallel to the xy-plane of a suitable coordinate system and the stacking direction is in the z-direction of the coordinate system. Optionally, the building material is a photopolymer, which is hardened after deposition by exposure to suitable electromagnetic radiation, typically UV radiation.

For many construction objects, because of the complexity and/or shape of the objects, construction layers comprising only BM printed in the shape of cross sections of the construction objects are not completely self-supporting and require support during construction of the object. For such cases, at least one construction material, hereinafter referred to as "support material" (SM), is printed as required in suitable regions of each layer to provide support for the building material in the layer. The support material and/or a shape in which it is formed, is such that upon completion of the object it can be removed from the object without substantially damaging the building material. In some embodiments, the support material, like the building material, is also a photopolymer.

An ink-jet type of RPA typically comprises at least one ink-jet printing head comprised in a "printing head block", which is mounted to a "shuttle". Each printing head has an array of one or more output orifices and is controllable to dispense construction material from each orifice independently of dispensing construction material from the other orifices. The construction material comprises one or more types of photopolymer materials typically stored in at least one cartridge from which a suitable configuration of pipes transports the material or materials to one or more reservoirs in the printing head block from which the printing head receives the material. Optionally, to maintain appropriate viscosity of the at least one photopolymer, a controller controls at least one heater, optionally mounted to the printing block, print head and/or reservoir, to heat the photopolymer to a suitable operating temperature. The one or more types of photopolymers may, generally, be dispensed in any combination, separately or together, simultaneously or consecutively.

During construction of an object, a controller controls the shuttle to repeatedly move over a support surface, hereinafter a "construction platform", parallel to the xy-plane. As the shuttle moves, the controller controls each printing head to dispense construction material selectively through its orifices responsive to construction data defining the object to print the construction layers from which the object is made on the construction platform, one layer after the other, one on top of the other. Mounted to the shuttle, adjacent to the printing head block are one or more sources of electromagnetic radiation, optionally UV radiation, for curing the photopolymer construction material printed in each construction layer. Also, optionally, mounted to the shuttle adjacent to the at least one printing head block is a "leveling roller" which levels newly printed layers of construction material to a predetermined layer height by removing surplus material and/or peaks of material in the layer. The surplus material removed from the layer is wiped off the roller by a "cleaning wiper" and gathered in a waste container comprised in the shuttle.

Optionally, in moving the shuttle over the support surface during production of a construction layer, the controller controls the shuttle to move back and forth along the x-direction. Optionally, at any one or more reversals of the shuttle along the x-direction the controller increments displacement of the shuttle in the y-direction. Following production of a given construction layer, either the construction platform is lowered or the shuttle raised, along the stacking direction by a distance equal to a thickness of a next construction layer to be produced over the just formed given layer.

During construction of an object, excess cured photopolymer construction material has a tendency to accumulate on or between the at least one printing head in the printing head block and on the cleaning wiper. The accumulated material may result in total or partial blockage of output orifices, generating inaccuracies in deposition of construction material and/or damage to a printed layer as the printing heads and roller move over a printed layer. Often, functioning of a printing head block may be so degraded by accumulated photopolymer "debris" that the printing block must be replaced. Replacing a printing head block is generally expensive, time consuming, and requires recalibration of the RPA so that deposition of polymer via the output orifices can be accurately controlled.

Configurations of ink-jet type RPAs are described in U.S. Pat. No. 6,259,962, U.S. Pat. No. 6,658,314, U.S. Pat. No. 6,569,373 and U.S. application Ser. Nos. 10/101,089, 09/484,272, 10/336,032, the disclosures of which are incorporated herein by reference.

SUMMARY OF THE INVENTION

An aspect of some embodiments of the invention relates to providing an ink-jet type rapid production apparatus (RPA) having improved operational characteristics.

An aspect of some embodiments of the invention relates to providing an RPA comprising a shuttle having a printing head block for which each printing head therein is dismountable and replaceable independently of the other printing heads in the block.

In accordance with an embodiment of the invention, the shuttle and printing heads are configured so that when a printing head is replaced it is automatically aligned by alignment structures comprised in the printing head block and the printing head. In accordance with an embodiment of the invention the printing head is associated with a memory comprising profile data that specifies operating characteristics of the printing head that is used by a controller in the RPA to control the printing head. In some embodiments of the invention the memory is comprised in the printing head.

An aspect of some embodiments of the invention relates to providing an RPA having an improved lamp that provides radiation for curing photopolymer construction materials.

Photopolymer construction material along edges of construction layers formed by an RPA is often poorly polymerized resulting in edges that sometimes have relatively poor definition and may remain soft and sticky. A radiation lamp, in accordance with an embodiment of the invention provides a relatively large portion of its radiant energy so that the radiation is incident on construction layers at relatively large angles to a normal to their planes. The large incident angle radiation is relatively more efficient in polymerizing material along edges of a construction layer than radiation that is incident at relatively small angles. An aspect of some embodiments of the invention relates to providing an RPA having an improved cleaning wiper for removing photopolymer debris that accumulates on surfaces of the RPA.

There is therefore provide in accordance with an embodiment of the invention apparatus for producing an object by sequentially forming thin layers of a construction material one on top of the other responsive to data defining the object, the apparatus comprising:

a plurality of printing heads each having a surface formed with a plurality of output orifices and controllable to dispense the construction material through each orifice independently of the other orifices;

a shuttle to which the printing heads are mounted;

a support surface; and a controller adapted to control the shuttle to move back and forth over the support surface and as the shuttle moves to control the printing heads to dispense the construction material through each of their respective orifices responsive to the data to form a first layer on the support surface and thereafter, sequentially the other layers; wherein each printing head is dismountable from the shuttle and replaceable independently of the other printing heads.

Optionally, each printing head comprises at least one registration structure that matches a registration structure comprised in the shuttle and when a printing head is mounted to the shuttle its at least one registration structure contacts the corresponding shuttle registration structure and positions the printing head accurately in the shuttle. Optionally, the orifices in each printing head are equally spaced in a linear array having a first orifice located at a first end of the array. Optionally, the at least one registration structure comprised in each printing head and its corresponding shuttle registration structure position the printing heads so that their respective lines of orifices are parallel. Optionally, wherein the lines of orifices are arrayed along a direction perpendicular to the lines of orifices. Optionally, the at least one registration structure comprised in each printing head and its corresponding shuttle registration structure, position the printing heads so that the first orifice in each printing head is accurately positioned relative to the first orifices of the other printing heads. Optionally, projections on the support surface of parallel lines through the centers of the orifices that are perpendicular to the lines of orifices are substantially equally spaced one from the other. Optionally, distances of the first orifices from a same plane perpendicular to the lines of orifices are located at distances from the plane in accordance with an expression of the form $y(n)=C+n(d_y/N)$, where y is the distance from the plane, C is a constant, N is a number of printing heads, $d_y$ is a distance between adjacent orifices in a same printing head and for each of the printing heads, n is a different integer satisfying $0 \leq n \leq (N-1)$. Optionally, the controller controls the shuttle to move along a direction perpendicular to the lines of orifices when construction material is dispensed from orifices in the printing heads during formation of a layer. Optionally, the distances y(n) are such that a printing head deposits droplets on a given line in the layer parallel to the lines of orifices at locations such that the droplets are substantially not contiguous with any droplets of material deposited previously on the given line by other of the N printing heads. Optionally, each droplet deposited between two closest, previously deposited droplets on the given line, is equidistant from the two previously deposited droplets In some embodiments of the invention, the at least one registration structure in each printing head comprises at least one registration pin that protrudes from the printing head and has an end accurately positioned relative to the line of orifices.

Optionally, the corresponding shuttle registration structure is a surface and wherein the registration pin and registration surface are positioned so that when the printing head is mounted to the shuttle the tip of the pin butts up against the surface. Alternatively or additionally, the at least one registration pin comprises three registration pins. Optionally, a line between the tips of two of the registration pins is accurately parallel to the line of orifices. Optionally, the tip of a third registration pin is displaced parallel to the line of orifices and away from all the orifices by an accurate distance relative to the first orifice.

In some embodiments of the invention, each printing head is associated with a memory. Optionally, the memory is comprised in the printing head. Additionally or alternatively, the memory comprises profile data that specifies operating characteristics peculiar to the printing head that the controller uses to control the printing head. Optionally, the profile data becomes accessible to the controller automatically when the printing head is mounted to the shuttle. Additionally or alternatively, each orifice is associated with its own actuator controllable to control dispensing of the construction material from the orifice and wherein the profile data comprises data useable to control the actuator.

In some embodiments of the invention, the apparatus comprises a temperature monitor that generates signals responsive to temperature of the printing head. Optionally, the memory comprises calibration data that correlates a characteristic of the signals with temperature of the printing head.

In some embodiments of the invention, the printing head comprises a heat source controllable to maintain the printing head at a desired temperature and wherein the memory comprises data useable to control the heat source.

In some embodiments of the invention, the memory comprises data useable to determine the position of the orifices relative to the orifices of other printing heads mounted to the shuttle.

In some embodiments of the invention, the construction material comprises a photopolymer. Optionally, the apparatus comprises a lamp that provides radiation to polymerize the photopolymer. Optionally, the lamp provides a substantial portion of the radiation so that it is incident on the layers at substantially non-normal angles to their planes.

There is further provided, in accordance with an embodiment of the invention, apparatus for producing an object by sequentially forming thin layers of a material one on top of the other responsive to data defining the object, the apparatus comprising:

at least one printing head having a surface formed with at least one output orifice and controllable to dispense a photopolymer material in liquid form through the orifice;

a lamp controllable to provide radiation that polymerizes the photopolymer; and a controller adapted to control the printing head to dispense the photopolymer and sequentially form the layers and the lamp to irradiate and polymerize the dispensed photopolymer; wherein a substantial portion of radiation provided by the lamp is directed so that it is incident at a substantially non-normal angle on the layers.

Optionally, the lamp comprises a radiation source and a reflector that reflects light provided by the source so that it is incident at a substantially non-normal angle on the layers. Additionally or alternatively, the magnitude of the angle is greater than 20° relative to the normal to the layers. In some embodiments of the invention, the magnitude of the angle is greater than about 30° relative to the normal. In some embodiments of the invention, the magnitude of the angle is equal to about 45° relative to the normal.

In some embodiments of the invention, the reflector comprises at least one parabolic reflector and at least a portion of the light source is located at the focus of the reflector. Optionally, the reflector is a polygonal reflector that approximates a parabolic reflector. Optionally, the angle of incidence is positive for a portion of the light and negative for a portion of the light.

In some embodiments of the invention, the radiation source is a discharge type bulb. Optionally, the bulb is an Hg or Xe discharge bulb.

In some embodiments of the invention, the lamp comprises LEDs controllable to provide the radiation that polymerizes the photopolymer.

There is further provided in accordance with an embodiment of the invention, Apparatus for producing an object by sequentially forming thin layers of a material one on top of the other responsive to data defining the object, the apparatus comprising:

at least one printing head controllable to dispense a photopolymer material in liquid form;

a lamp controllable to provide radiation that polymerizes the photopolymer; and a controller adapted to control the printing head to dispense the photopolymer and sequentially form the layers and the lamp to irradiate and polymerize the dispensed photopolymer; wherein the lamp comprises an array of LEDs controllable to provide the radiation that polymerizes the photopolymer.

Optionally the apparatus comprises a microlens that configures light from the LED into a cone beam of radiation having a relatively large cone angle. Optionally, the cone angle is larger than about 80°. Optionally, the cone angle is larger than about 100°.

In some embodiments of the invention, the array of LEDs is located relatively far from the layers and comprising a radiation conductor for each LED in the array that pipes radiation from the LED to a location relatively close to the layers from which the radiation illuminates regions of the layers.

In some embodiments of the invention, the controller controls intensities of UV light provided by LEDs in the array independently of intensities provided by other LEDs in the array.

In some embodiments of the invention, the controller turns on and off LEDs in the array so as to reduce radiation from the array that is not effective in polymerizing photopolymer in the layers.

In some embodiments of the invention, the apparatus comprises a wiper and wherein the controller is adapted to move at least one printing head over the wiper to clean the surface in which the orifices are formed.

There is further provided in accordance with an embodiment of the invention, apparatus for producing an object by sequentially forming thin layers of a material one on top of the other responsive to data defining the object, the apparatus comprising:

at least one printing head having a surface formed with at least one output orifice and controllable to dispense a photopolymer material in liquid form through the orifice;

a wiper; and a controller adapted to control the printing head to dispense the photopolymer and sequentially form the layers move the printing head over the wiper to clean the surface in which the orifices are formed.

Additionally, or alternatively, the wiper comprises at least one cleaning blade having an edge that scrapes excess construction material from the surface when the controller controls the surface to move over the wiper.

Optionally, the edge of at least one cleaning blade contacts the surface when the surfaces move over the wiper.

Optionally, the cleaning blade is formed from a resilient material so that the edge that contacts the surfaces resiliently contacts the surface. Optionally, the edge is scalloped and has a different scallop corresponding to each printing head of the at least one printing head.

In some embodiments of the invention, the at least one printing head comprises a plurality of printing heads.

Optionally, the cleaning blade is formed with at least one slot that partitions the cleaning blade into a plurality of teeth each having an edge that contacts an orifice surface of a different one of the plurality of printing heads and scrapes excess construction material form the surface.

Additionally or alternatively, wherein the at least one cleaning blade comprises at least two cleaning blades. Optionally, a cleaning blade of the at least two cleaning blades has an edge that does not contact the orifice surface of a printing head but moves along and in close proximity to the surface when the controller controls the surface to move over the wiper. Optionally, when the surface moves over the wiper, regions of the surface move over the edge that does not contact the surface prior to contacting the edge that contacts the surfaces.

In some embodiments of the invention, the apparatus comprises an obstacle detection system that detects defects in a layer that protrude from a surface of the layer. Optionally, the obstacle detection system comprises: a laser that provides a laser beam that contacts or is located close to the surface of the layer along a length of the laser beam; and a detector that receives light from the laser beam; wherein light that the detector receives from the laser is at least partially blocked by a defect that protrudes from the surface.

An aspect of some embodiments of the invention relates to providing new construction materials for use in a jet-ink RPA, which when used to construct an object results in the object having improved structural strength relative to that which it would have if produced using prior art ink-jet construction materials.

BRIEF DESCRIPTION OF FIGURES

Non-limiting examples of embodiments of the present invention are described below with reference to figures attached hereto, which are listed following this paragraph. In the figures, identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION OF EXEMPLARY EMBODIMENTS

Figure 1:
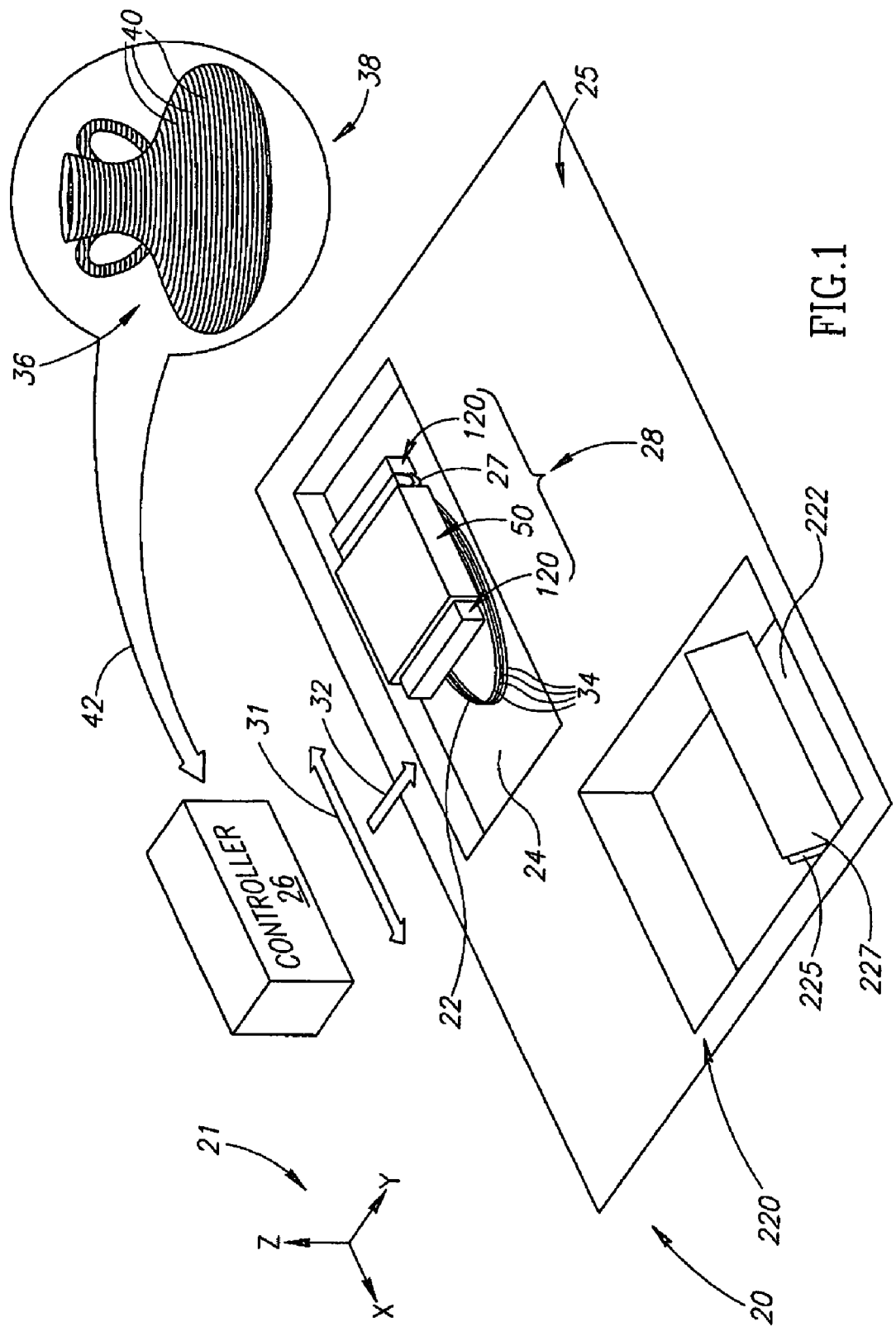
FIG. 1 schematically shows a rapid production apparatus (RPA) in accordance with an embodiment of the present invention.

FIG. 1 schematically shows an ink-jet RPA 20 producing an object 22 on a construction platform 24, in accordance with an embodiment of the present invention. RPA 20 comprises a controller 26 and a shuttle 28 comprising a printing head block 50, a leveling roller 27 and, optionally, two sources 120 of radiation suitable for polymerizing photopolymers used by the RPA to construct objects, in accordance with an embodiment of the invention. Optionally, construction platform 24 is mounted to a worktable 25 and is controllable to be lowered and raised with respect to the worktable.

Periodically, during production of object 22, RPA 20 controller 26 moves shuttle 28 to a maintenance area 220 on worktable 25 comprising a sump 222 and at least one cleaning blade. By way of example, maintenance area 220 comprises two cleaning blades, a first cleaning blade 225 and a second cleaning blade 227. At maintenance area 220 controller 26 performs a cleaning procedure to remove waste construction material, "debris", that may accumulate on printing heads comprised in printing head block 50. Maintenance area 220 and the cleaning procedure is discussed below.

For simplicity, it is assumed that photopolymers used by RPA 20 are UV curable and that radiation sources 120 are UV lamps. RPA 20 is shown very schematically and only features and components of the RPA germane to the discussion are shown in FIG. 1. A coordinate system 21 is used to reference locations and positions of features and components of RPA 20.

To produce object 22, controller 26 controls shuttle 28 to move back and forth over construction platform 24, optionally, parallel to the x-axis in directions indicated by a double headed block arrow 31. Following one or more reversals of direction along the x-axis, the controller may advance shuttle 28 by an incremental distance, optionally, parallel to the y-axis along a direction indicated by block arrow 32. As shuttle 28 moves over construction platform 24 controller 26 controls the printing heads responsive to construction data that defines object 22, to dispense construction material (building material, BM, and/or support material, SM, as required) and form construction layers 34 that are used to produce the object.

After construction material is freshly printed to form a region of a given construction layer 34, leveling roller 27 contacts the region, and flattens and levels it to a desired thickness by shaving off an upper portion of the printed material. To achieve the shaving action, roller 27 rotates in a direction that it would rotate were it rolling on the construction layer in a direction along which shuttle 28 advances, but at a speed of rotation greater than that which corresponds to the linear speed of advance of the shuttle. A suitable wiper and waste material "catchment" (not shown) mounted in shuttle 28 cleans waste construction material from roller 27.

Construction layers 34 are stacked in a direction, i.e. a stacking direction, perpendicular to construction platform 24, parallel to the z-axis. Following formation of a given construction layer 34, optionally, construction platform 24 is lowered by a distance substantially equal to a thickness of a next construction layer to be formed on the given construction layer. For convenience of presentation, thickness of construction layers 34 is greatly exaggerated in FIG. 1.

By way of example, object 22 is a copy of a vase 36 shown in an inset 38 and is shown on construction platform 24 partially constructed. Vase 36 is schematically shown formed from "data cross section" layers 40 that are defined by the vase's construction data. A block arrow 42 schematically indicates that the construction data is input to and/or generated responsive to appropriate input data, in controller 26 and suitably formatted to control production of construction layers 34.

Figure 2A:
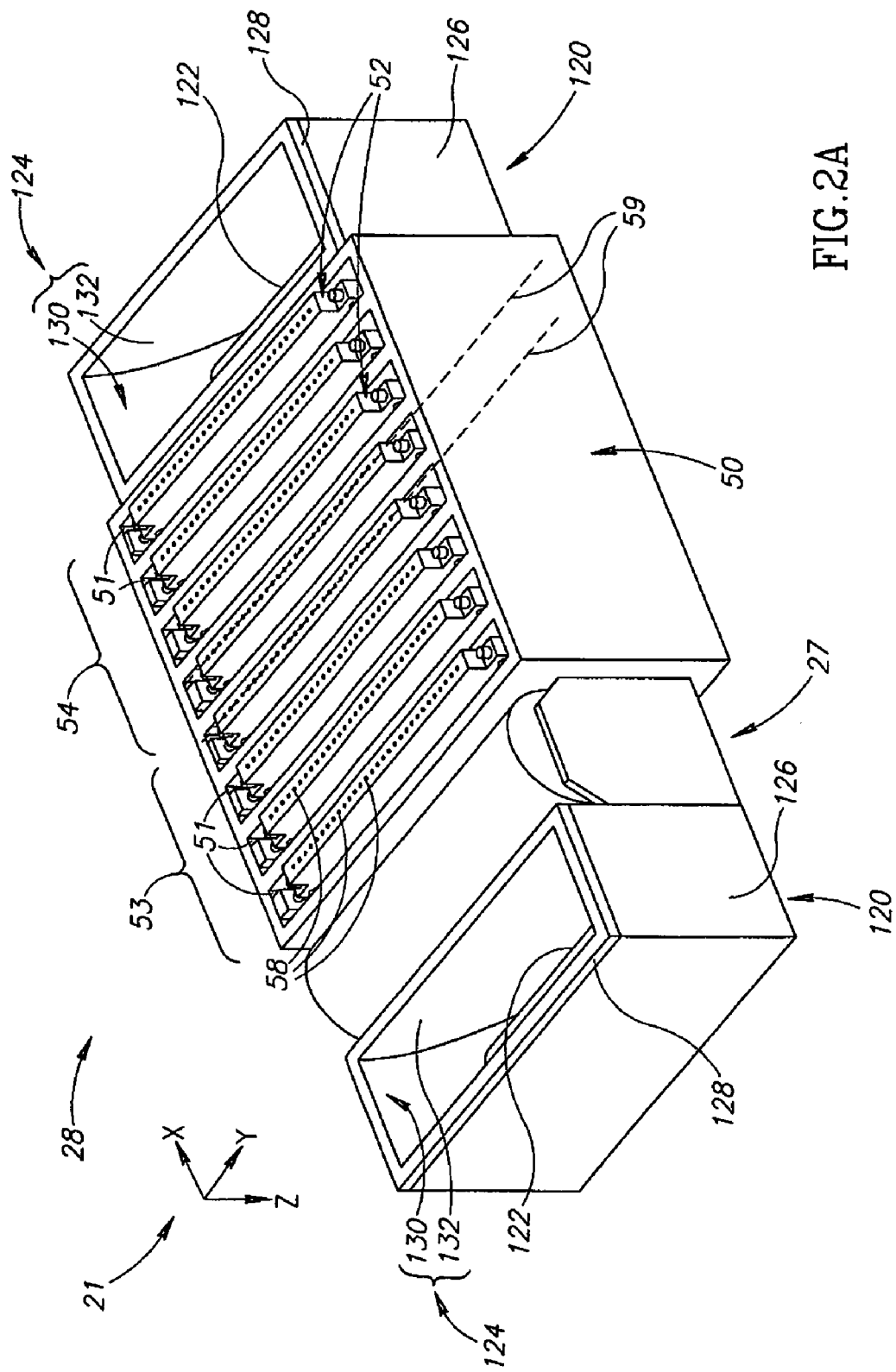
FIG. 2A schematically shows a bottom perspective view of a shuttle, which is comprised in the RPA shown in FIG. 1 and has individually replaceable printing heads, and, in accordance with an embodiment of the invention.

FIG. 2A schematically shows shuttle 28 in a perspective view as seen from the bottom of the shuttle. From the perspective of FIG. 2A coordinate system 21 has its x-axis and its z-axis inverted with respect to the directions of these axes shown in FIG. 1.

Printing head block 50 is optionally formed with a plurality of sockets 51, each of which is adapted to receive a printing head 52 that may be inserted and removed from the socket independently of having to insert or remove a printing head from others of the sockets. Sockets 51 are more clearly shown in FIGS. 2B and 2C, which show shuttle 28 as seen from the bottom, respectively with and without printing heads 52 inserted into the sockets. FIG. 2D schematically shows a printing head 52 in accordance with an embodiment of the invention, by itself, in which details of the printing head are more clearly shown than in FIGS. 2A-2C.

By way of example, block 50 comprises eight sockets 51. Optionally, different printing heads 52 or different groups of printing heads 52 are dedicated to printing different construction materials. For example, some of printing heads 52 may be dedicated to printing only BM or a particular type of BM, while other printing heads 52 may be dedicated to printing only SM or a particular type of SM. Printing heads 52 may be designated and configured as BM or SM dedicated printing heads substantially in any manner. For example, a number of printing heads 52 dedicated to printing BM may be different from a number of printing heads 52 dedicated to printing SM. Additionally or alternatively, adjacent printing heads 52 may be dedicated to printing different construction materials, one to printing BM and the other to printing SM.

By way of example, in printing head 50, a group of four printing heads 52 inserted into sockets 51 indicated by bracket 54 are assumed to be dedicated to printing BM and a group of four printing heads 52 inserted into sockets 51 indicated by a bracket 53 are assumed dedicated to printing SM. Where convenience warrants, sockets 51 indicated by bracket 53 are also referred to as sockets 53 and sockets 51 indicated by bracket 54 are also referred to as sockets 54.

Printing head block 50 and printing heads 52 are configured, in accordance with an embodiment of the invention, so that each printing head may be relatively easily replaced, for example, as may be required because of damage or as indicated by a service regimen. Optionally, all printing heads 52 are substantially the same.

Each printing head 52 comprises a housing 56, most clearly shown in FIG. 2D, formed with a plurality of collinear, optionally equally spaced output orifices 58 through which construction material is dispensed. For convenience a dashed line 59 shown in FIG. 2D, and shown for some printing heads 52 in FIGS. 2A and 2B, indicates a line along which collinear orifices 58 are arrayed. Description of methods and devices for providing construction material to printing heads 52, in accordance with an embodiment of the invention, are given below in the discussion of FIGS. 2E and 2F.

A circuit board 55 comprises circuitry 57 for controlling piezoelectric actuators (not shown) comprised in housing 56 that are actuated to dispense construction material through orifices 58 and other components of printing head 52. Connectors 47 connect circuit board 55 to circuitry in printing head block 28 that connects to controller 26 (FIG. 1). In accordance with an embodiment of the invention, circuit board 55 comprises a memory 49 having data, "profile data" that specifies operating characteristics of printing head 52. Profile data optionally comprised in memory 49 is discussed below.

Printing heads 52 and printing head block 50 comprise corresponding alignment features. Some of the alignment features cooperate to automatically align a printing head 52 when the printing head is inserted into any one of sockets 51 so that its line 59 of output orifices 58 is parallel to a same line, which is, optionally, the y-axis. Lines 59 of orifices 58 in all printing heads 52 mounted to printing head block 50 are therefore parallel to each other to a relatively high degree of accuracy. Optionally, lines 59 of orifices 58 in printing heads 52 are equally spaced one from the other.

Some of the corresponding alignment features cooperate to align printing heads 52 so that, optionally, the y-coordinates of orifices in different printing heads dedicated to print a same construction material are different. For example, in accordance with an embodiment of the invention, the y-coordinates of orifices 58 in different printing heads 52 inserted in sockets 53 (i.e. sockets 51 indicated by bracket 53) are different. Similarly, whereas the y-coordinates of orifices 58 in a printing head 52 inserted into a socket 54 (i.e. a socket 51 indicated by bracket 54) may be the same as the y-coordinates of orifices in a printing head 52 inserted into a socket 53, the y-coordinates of orifices 58 in two different printing heads 52 in sockets 54, are different. Optionally, the configuration of printing heads in sockets 54 is the same as that of printing heads in sockets 53 and the discussion below, while referring to printing heads in sockets 54, is understood to, optionally, apply to printing heads in sockets 53.

Let a first orifice 58 in each printing head 52 be an orifice closest to the xz plane (FIG. 2A) and let a distance between adjacent orifices in a same printing head be "$d_y$". Optionally, the y-coordinate of the first orifice in each printing head 52 located in a socket 54 has a value given by an expression of the form $$y = C + n(d_y/N) = C + n\Delta d_y \qquad 1)$$

where N is a number of sockets 54, $\Delta d_y = d_y/N$ and for each socket n is a different integer satisfying the condition $0 \leq n \leq (N-1)$.

Figure 2B:
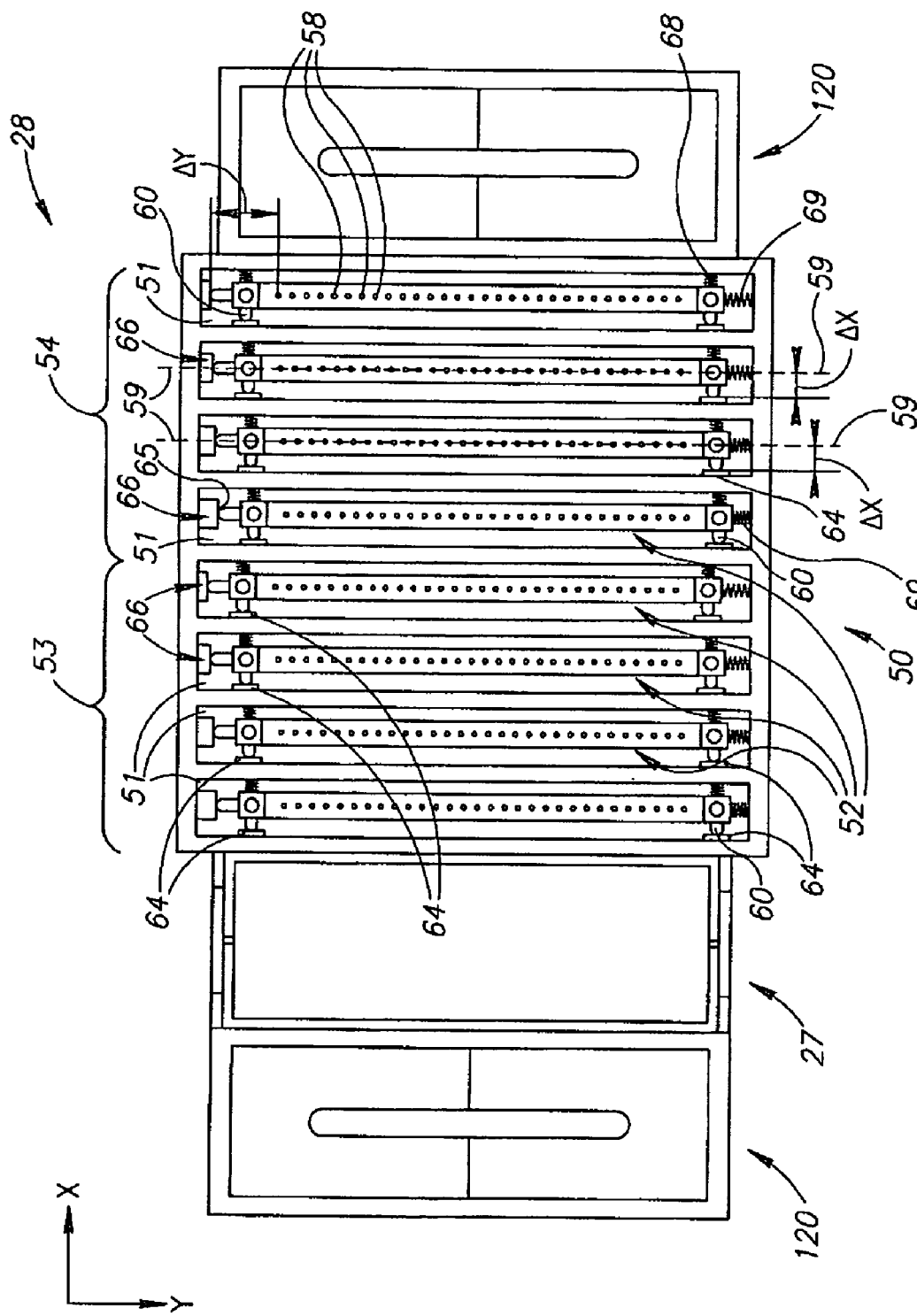
FIG. 2B schematically shows a bottom view of the shuttle show in FIG. 2A.
Figure 2C:
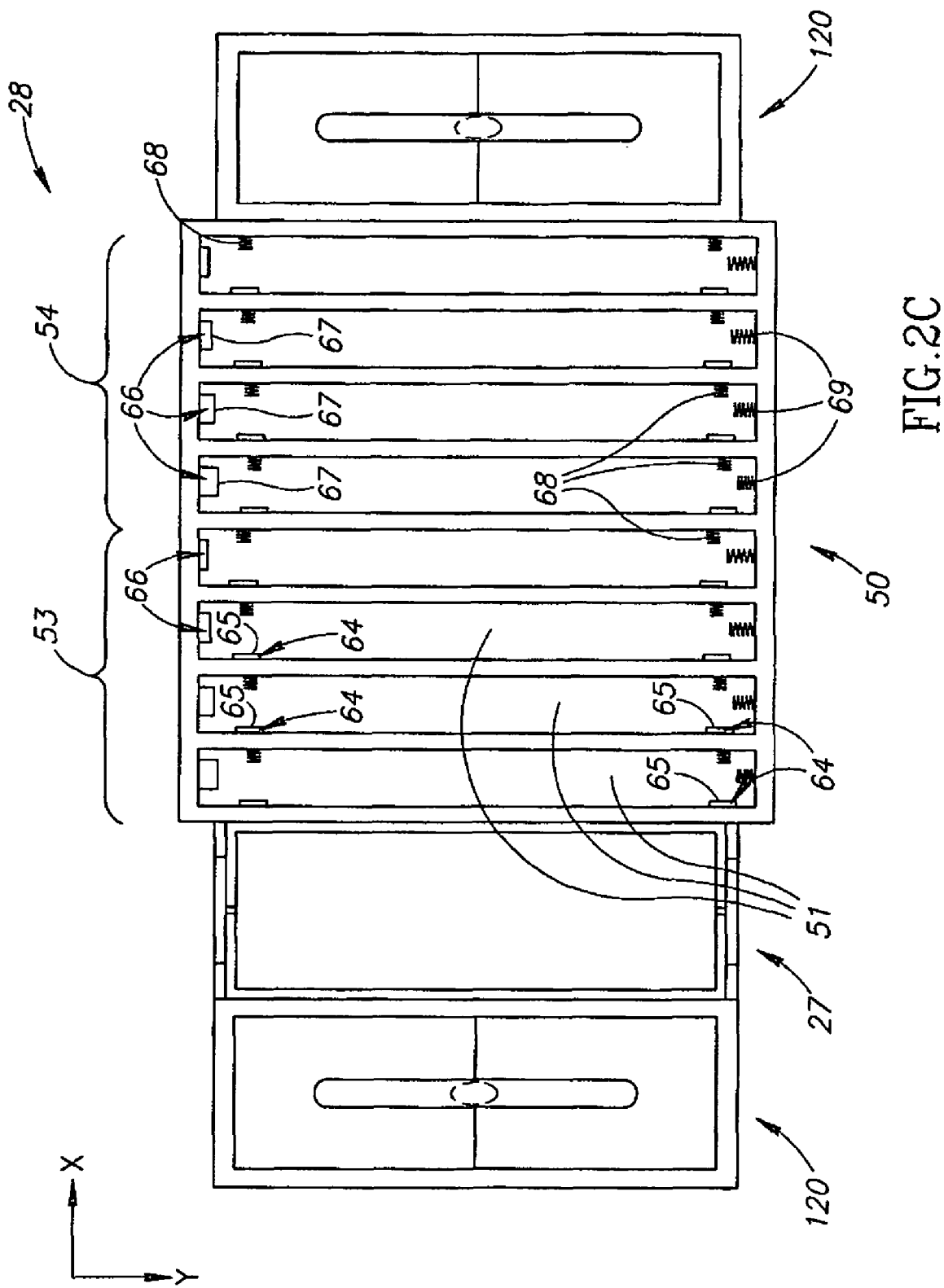
FIG. 2C schematically shows the shuttle in FIGS. 2A-2B with its printing heads removed.
Figure 2D:
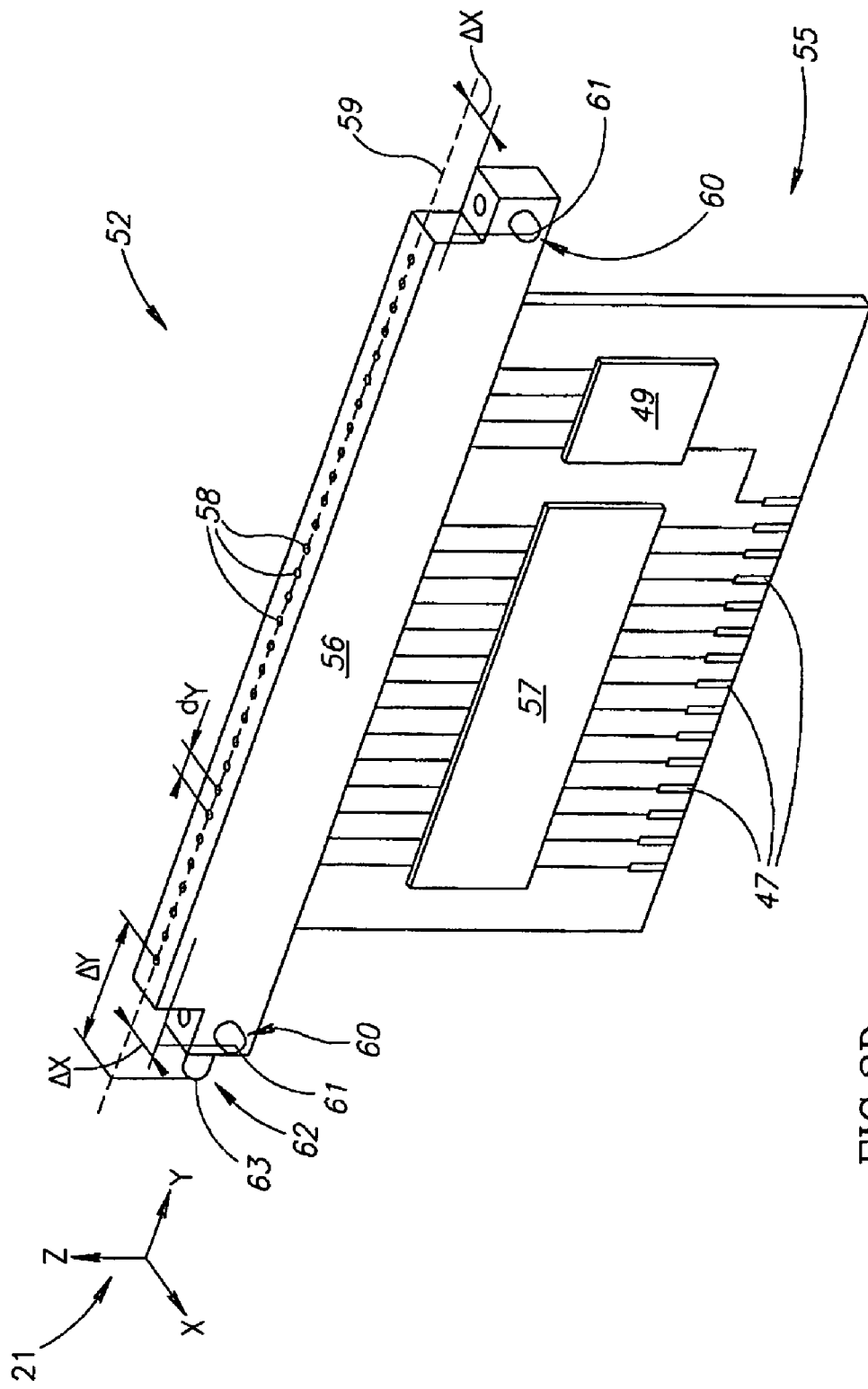
FIG. 2D schematically shows a printing head, in accordance with an embodiment of the invention.

Optionally, the alignment features comprise for each printing head 52, two x alignment pins 60 and a y alignment pin 62 (most clearly shown in FIGS. 2B and 2D). Optionally, each x pin has a rounded end having a tip 61 and each y pin 62 has a rounded end having a tip 63. Tip 61 of each x pin 60 is displaced by a same accurate distance $\Delta x$ along the x-axis relative to the x-coordinate of line 59. Optionally, $\Delta x$ is substantially the same for all printing heads 52. Tip 63 of y pin 62 is displaced, by an accurate distance $\Delta y$ along the y-axis from the y-coordinate of the first orifice of printing head 52. Optionally, $\Delta y$ is substantially the same for all printing heads 52.

Each socket 54 comprises two x-alignment buttons 64 and a y alignment button 66 corresponding respectively to x alignment pins 60 and y alignment pin 62 comprised in each printing head 52. X alignment buttons 64 are not shown in FIG. 2A but are schematically shown in FIG. 2B and most clearly in FIG. 2C. Each x alignment button 64 has a same accurately controlled length and ends in a planar "alignment surface" 65. Each socket 54 comprises at least one resilient element 68, such as a leaf or coil spring. When a printing head 52 is inserted into socket 54 the at least one resilient element 56 presses the printing head so that tips 61 of its x alignment pins 60 contact x alignment surfaces 65 of alignment buttons 64 in the socket. The configuration of x alignment pins 60 and buttons 64 result in lines 59 of orifices 58 of printing heads 52 inserted into sockets 51 being relatively accurately parallel.

Each y-button 66 comprised in sockets 54 has a different length, optionally given by equation 1, and ends in a planar alignment surface 67. A resilient element 69 comprised in each socket 54 resiliently urges a printing head 52 inserted into the socket so that the printing head's y alignment tip 63 presses against y-alignment surface 67 of the alignment button comprised in the socket. The configuration of y alignment pins 62 and buttons 66 provide that the first orifice 58 of each printing head 52 inserted into a different one of sockets 54 has a different y-coordinate, optionally given by equation 1. Orifices 58 of each printing head 52 in a socket 54 are thereby displaced relative to the orifices of the other printing heads in sockets 54 by a different multiple of $(d_y/N) = \Delta d_y$. Projections of orifices 58 from all printing heads 52 in sockets 54 onto a line parallel to the y-axis are equally spaced along the line by a distance equal to $\Delta d_y$. By way of example, for the configuration of sockets 54 and y alignment buttons 66 shown in FIG. 1, displacement of printing heads 54 along the y-axis decreases linearly with increase of the x-coordinate of the printing heads relative to the x-coordinate of fixed feature of printing head block 50.

Figure 2E:
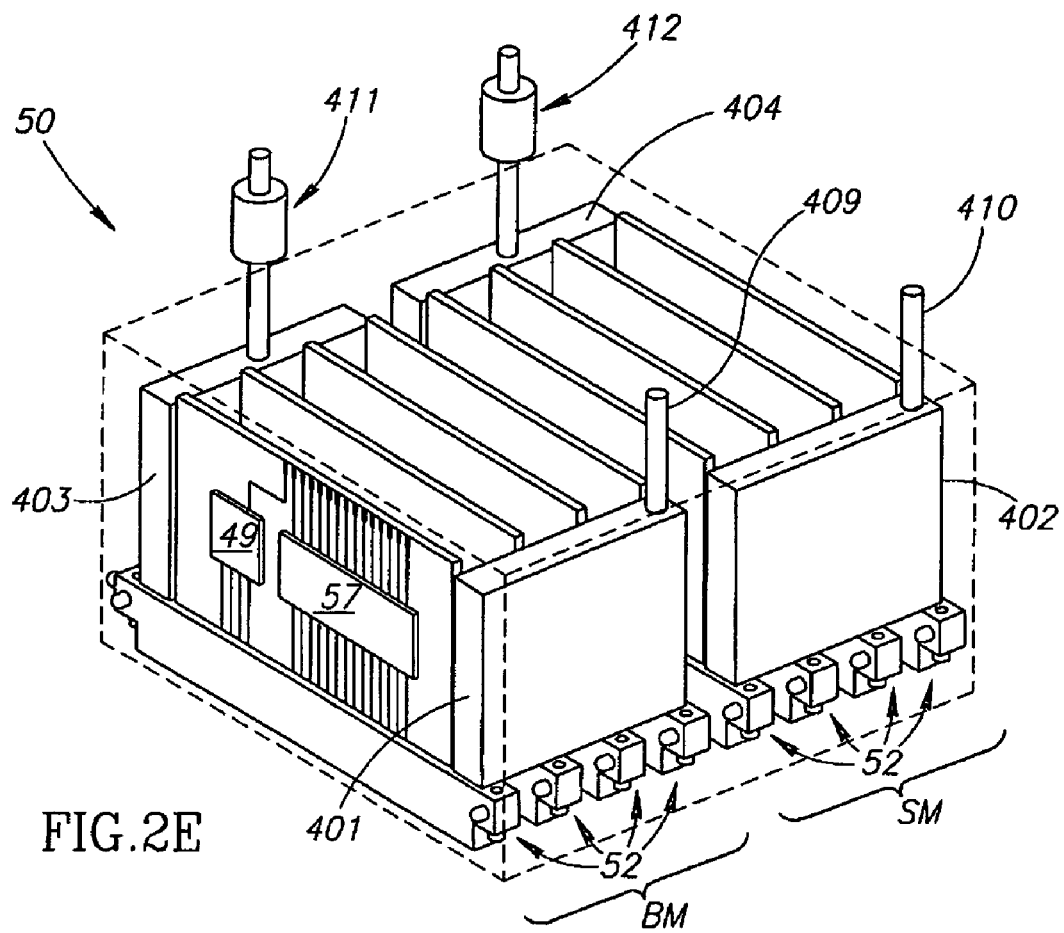
FIGS. 2E and 2F schematically show perspective and cross section views respectively of a system for providing construction material to printing heads in an RPA, in accordance with an embodiment of the present invention.
Figure 2F:
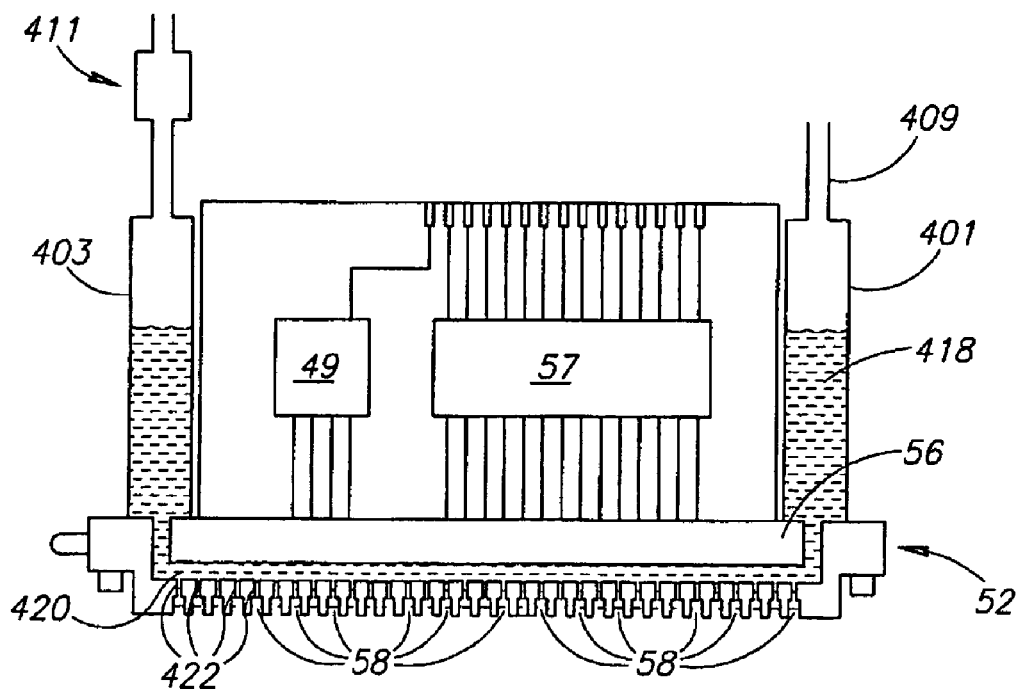

FIG. 2E schematically shows a perspective view of printing head block 50 right side up and printing heads 52 mounted in the block connected to reservoirs 401, 402, 403 and 404 comprised in the printing head block that store construction material provided to the printing heads. The printing heads and reservoirs are shown as if seen through the printing head block which is shown in dashed lines. FIG. 2F schematically shows a cross section view of a printing head 52 shown in FIG. 2E.

Printing heads 52 that are located in sockets 54 (FIGS. 2B and 2C) and, optionally, print building material (BM) are indicted by a bracket labeled "BM" and will be referred to as BM printing heads. Each BM printing head 52 is coupled to reservoirs 401 and 403 that store BM and provide BM to the printing heads. A supply line 409 connects reservoir 401 to a "supply" pump (not shown) that pumps BM to reservoir 401, optionally, from a BM supply cartridge, generally located at a distance from printing head block 50. A reflux safety valve 411 optionally connects reservoir 403 to a vacuum pump (not shown) that maintains a slight vacuum in reservoirs 401 and 402.

Similarly, a bracket labeled "SM" indicates printing heads 52 that are located in sockets 53 and, optionally, print support material (SM), and will be referred to as SM printing heads. Each SM printing head 52 is coupled to reservoirs 402 and 404 that store SM and provide SM to the SM printing heads. A supply line 410 connects reservoir 402 to a pump that pumps SM material from an SM supply cartridge. A reflux safety valve 412 connects reservoir 404 to a vacuum pump (not shown).

Operation of reservoirs 401 and 403 that supply BM to BM printing heads 52 is optionally identical to operation of reservoirs 402 and 404 that supply SM to SM printing heads 52 and operation of the reservoirs will be described with reference to reservoirs 401 and 403 and BM printing heads 52.

Referring to FIG. 2F, housing 56 of BM printing head 52 is formed with a manifold 420 that connects reservoir 401 and 403 and enables BM that the supply pump pumps to reservoir 401 to flow freely into reservoir 403. A sensor (not shown) generates signals responsive to a height to which BM fills reservoirs 401 and 403. Supply pump control circuitry (not shown) controls operation of the supply pump to maintain a desired level of BM in reservoirs 401 and 403. FIG. 2F schematically shows reservoirs 401, 403 and manifold 420 filled with BM indicated by shading 418.

A small feed line 422 formed from sections optionally having different diameters, as is known in the art, connects each output orifice 58 to manifold 420 and is coupled to a piezoelectric actuator (not shown). Controller 26 (FIG. 1) controls the piezoelectric actuator coupled to each feed line 420 to draw BM 418 from manifold 420 and expel desired quantities of the BM from the feed line's associated output orifice 58.

To prevent unintentional dripping of BM from orifices 58 the vacuum pump coupled, optionally, to reservoir 403 maintains a slight vacuum in reservoirs 401 and 403. Reflux safety valve 411 prevents BM in reservoir 403 from being accidentally drawn into the vacuum pump. Reflux safety valve 411 may function in accordance with any of various methods and devices known in the art. Optionally, the reflux safety valve comprises a float that rises to close a port in the valve through which the vacuum pump aspirates air, if and when BM enters the valve and rises above a predetermined level.

The inventors have found that a pressure in reservoirs 401 and 403 between about 2 and about 9 mm $H_2O$ below atmospheric pressure is advantageous for preventing unintentional dripping of BM from orifices 58. Monitoring of vacuum in reservoirs 401 and 403 and control of the vacuum pump that maintains the pressure may be accomplished using any of various methods and devices known in the art. In some embodiments of the invention, the vacuum pump operates continuously to draw air from reservoir 403 and air flows slowly into reservoir 401 and/or 403 through at least one vent. Suitable control circuitry controls the vacuum pump to balance a rate at which the pump draws air from reservoir 403 and a rate at which air flows into reservoir 401 and/or 403 through the at least one vent and maintain the desired slight vacuum. In some embodiments of the invention, control circuitry controls the vacuum pump to operate only when pressure in reservoir 403 rises above a desired pressure.

As shuttle 28 moves along the x-axis dispensing construction material to print a construction layer 34 (FIG. 1), droplets of construction material are dispensed from each orifice 58 of printing heads 52 as required onto construction platform 24 or onto a previously formed layer 34 along a line, hereinafter a "deposition line", parallel to the x-axis. Deposition lines for orifices 58 in a same printing head 52 that dispense BM (i.e. orifices in a printing head 52 in a socket 54) are equally spaced one from the other by a distance equal to $\Delta d_y$ (equation 1). A spatial resolution, hereinafter a "primary" y resolution $PR_y$, along the y-axis is therefore equal to $\Delta d_y$ and construction material is optionally deposited in droplets comprising sufficient material so that material deposited along adjacent deposition lines meld to form a smooth construction layer having substantially uniform thickness.

Figure 3A:
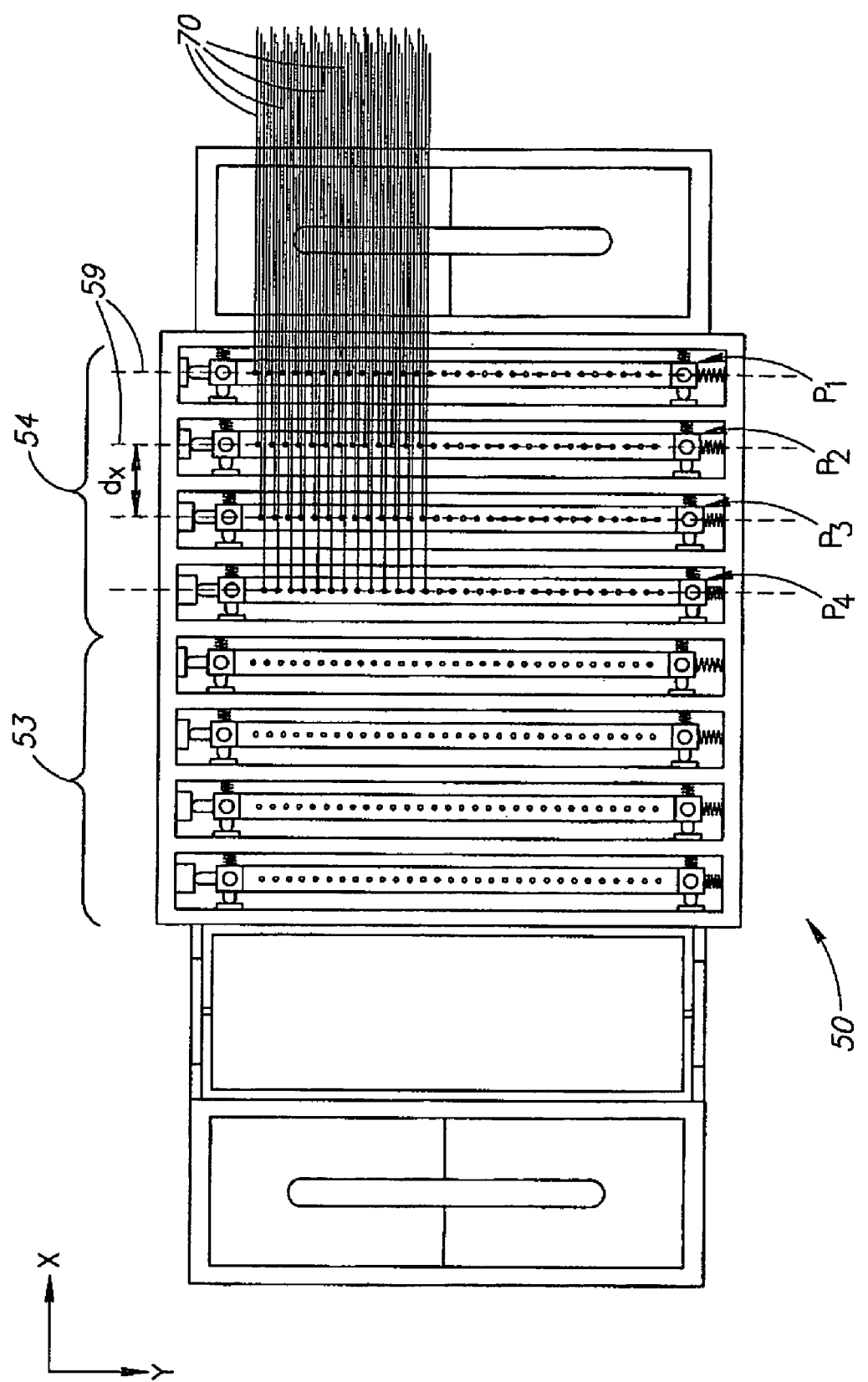
FIG. 3A schematically illustrates lines along which different output orifices of the printing head dispense construction material to form a construction layer of an object, in accordance with an embodiment of the invention.
Figure 3B:
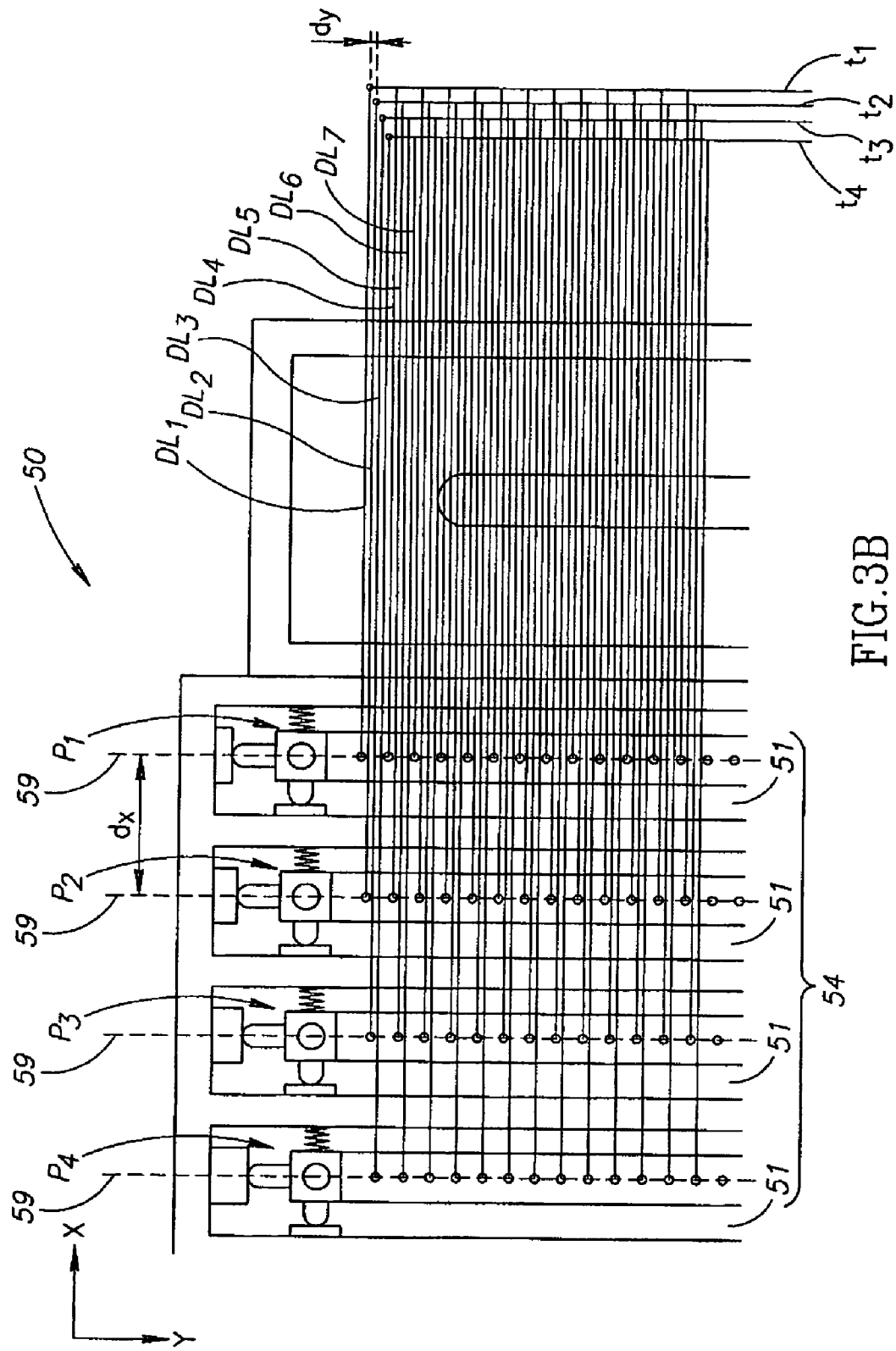
FIG. 3B shows a portion of FIG. 3A enlarged for convenience of presentation.

Deposition lines are schematically indicated by lines 70 in FIG. 3A for some orifices 58 of printing heads 52 in sockets 54. Although the deposition lines 70 are lines along a construction surface formed by RPA 20, the deposition lines are shown projected onto the bottom of printing head block 50 for convenience of presentation and to show their relationship to orifices 58 that determine their locations. FIG. 3B shows a magnified portion of FIG. 3A in which deposition lines 70 and their relative locations are more easily seen than in FIG. 3A.

It is convenient to individualize printing heads 52 in sockets 54 with indexed labels $P_k$, $1 \leq k \leq 4$ and deposition lines 70 with indexed label $DL_1, DL_2 \ldots DL_M$, which are shown in FIG. 3B (M is equal to the number of orifices 58 in a printing head $P_k$ times the number of printing heads, i.e. optionally four). Every fourth deposition line 70 is associated with an output orifice 58 in a same printing head $P_1$, $P_2$, $P_3$, or $P_4$ in a socket 54. For example, deposition lines $DL_1, DL_5, DL_9, \ldots$ are associated with printing head $P_1$.

Because of the distance between adjacent lines 59 of output orifices 58 in printing block 50, as shuttle 28 moves, for example along the positive x-axis, for locations at a same given x coordinate in a construction layer, construction material is dispensed at different times by different printing heads. Let the speed with which shuttle 28 moves along the x-direction be $V_s$ and a distance between orifice lines 59 in adjacent printing heads 52 be $d_x$. Then a time delay "$t_d$" between times at which construction material is dispensed by adjacent printing heads 52 at locations in a construction layer having a same given x-coordinate is equal to about $d_x/V_s$.

For example, if printing head $P_1$ deposits construction material at a given x-coordinate along deposition lines $DL_1$, $DL_5$, $DL_9$ . . . at a time $t_1$, then printing head $P_2$ deposits construction material at the same given x-coordinate along deposition lines $DL_2, DL_6, DL_{10} \ldots$ at time $t_2$, $t_d$ seconds later. Relative times $t_1, t_2, t_3$ and $t_4$ at which printing beads $P_1, P_2, P_3$ and $P_4$ dispense construction material from their output orifices 58 at a same given x-coordinate is represented by an extent to which their respective deposition lines extend to the right in FIGS. 3A and 3B. The ends of deposition lines 70 and relative times $t_1, t_2, t_3$ and $t_4$ are indicated by lines labeled with the relative times in FIG. 3B.

Droplets of liquid construction material that are deposited next to each other have an affinity to each other and a tendency to coalesce. This tendency to coalesce can generate imperfections in a construction layer, such as a construction layer 34 shown in FIG. 1, printed by RPA 20. In particular, the tendency to coalesce can result in a construction layer exhibiting striations parallel to deposition lines 70 along which RPA 20 deposits construction material. Striations, when they appear, tend to appear in the neighborhoods of deposition lines 70 along which printing head $P_4$ deposits construction material (i.e. $DL_4, DL_8, DL_{12}, \ldots$).

Figure 4A:
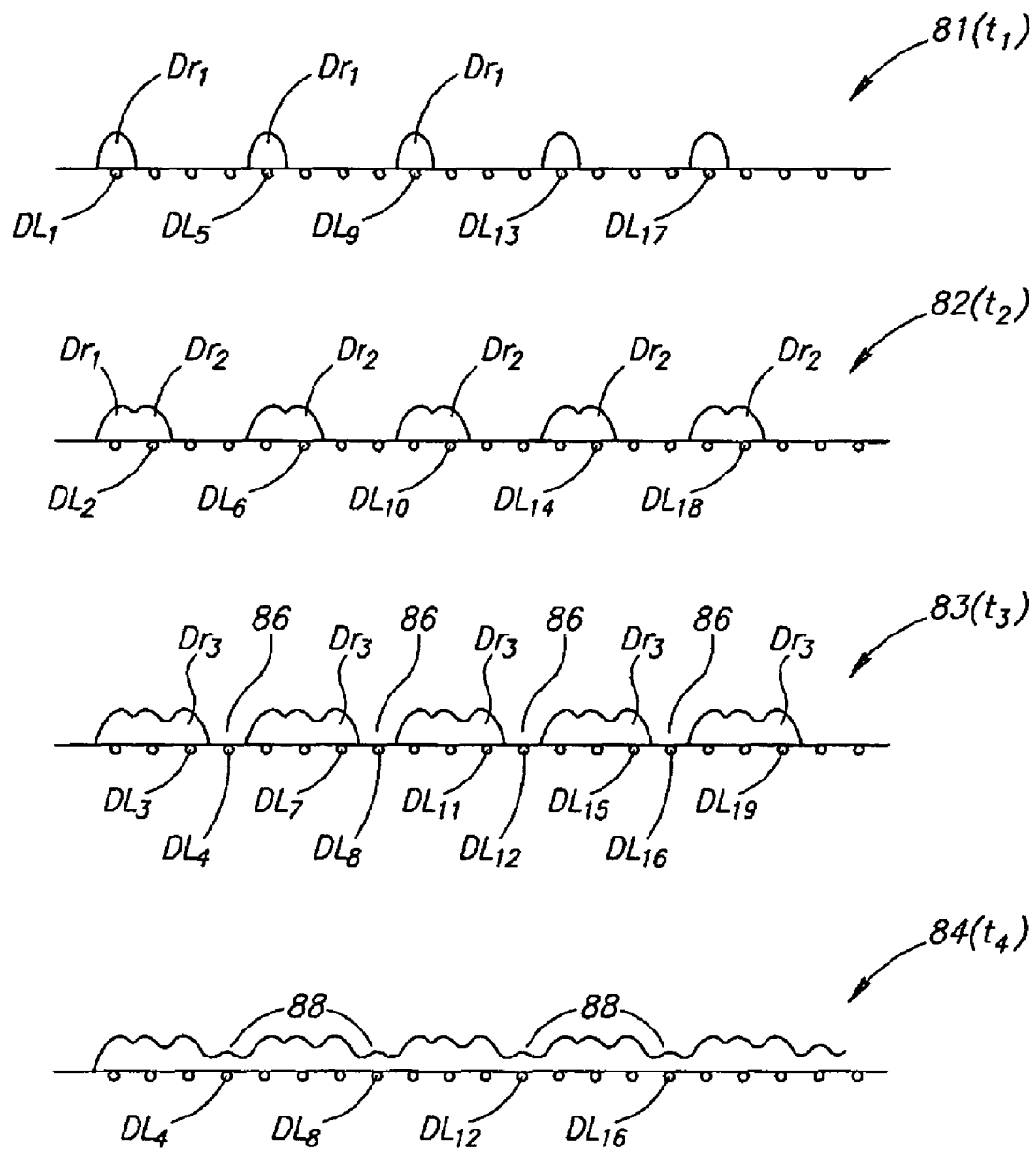
FIG. 4A schematically illustrates a method of dispensing construction material to produce a construction layer, in accordance with prior art.

FIG. 4A is believed to illustrate a process by which striations are formed in a construction layer. The figure shows a sequence of schematic time-lapse, cross section views 81, 82, 83 and 84 through a construction layer along a plane parallel to the xz plane at a given x-coordinate. The time-lapse views illustrate deposition of droplets along deposition lines 70 by printing heads $P_1$-$P_4$ to form a construction layer. Time-lapse views 81, 82, 83 and 84 are assumed to be taken respectively at sequential times $t_1, t_2, t_3$ and $t_4$ respectively that are temporally separated by the transit delay time $t_d$. Deposition lines along which droplets are deposited are indicated by circles labeled $DL_m$. Droplets of construction material that printing heads $P_1$-$P_4$ deposit are labeled $Dr_1$-$Dr_4$ respectively.

At time $t_1$, in time-lapse view 81, printing head $P_1$ deposits droplets $Dr_1$ of material along deposition lines $DL_1, DL_5, \ldots$ at locations having the given x-coordinate. At time $t_2$, in time-lapse view 82, printing head $P_2$ deposits droplets $Dr_2$ at the given x-coordinate along deposition lines $DL_2, DL_6, \ldots$. Each droplet $Dr_2$ is adjacent to a previously deposited droplet $Dr_1$ and tends to coalesce with the droplet $Dr_1$. At time $t_3$, in time-lapse view 83, printing head $P_3$ deposits droplets $Dr_3$ adjacent to droplets $Dr_2$ along deposition lines $DL_3$, $DL_8, \ldots$. Droplets $Dr_3$ coalesce with the previously deposited droplets $Dr_1$ and $Dr_2$ as shown in the time-lapse view.

It appears that material in the coalesced droplets does not readily flow into empty regions 86 shown in time-lapse view 83, in the neighborhood of deposition lines $DL_4, DL_8$, $DL_{12}, \ldots$ between the coalesced droplets. At time $t_4$, in time-lapse view 84, when printing head $P_4$ deposits droplets $Dr_4$ into empty regions 86, material in each droplet is drawn away to each of the groups of previously coalesced droplets on either side of the droplet. The drawing away of the material generates a slight lacuna 88 in the neighborhood of deposition line $DL_4$, as shown in time-lapse-view 84. Lacunae 88 give rise to striations in construction layers formed by RPA 20.

To obviate striations, in accordance with an embodiment of the present invention, y alignment buttons 66 comprised in sockets 54 are configured so that each droplet dispensed at a given x-coordinate, following deposition of material by a first printing head at the x-coordinate, is deposited equidistant between previously deposited droplets. The inventors have determined that when an "equidistant" method of droplet deposition is used to form a construction layer, striations that might occur in the construction layer were the droplets deposited as illustrated in FIG. 4A, are moderated or are substantially non-existent. It is noted that equidistant deposition can be exactly and completely implemented for deposition of droplets of construction material in a layer only if a number of deposition lines used to construct the layer is equal to a power of two. Otherwise, the method can be implemented only approximately.

Figure 4B:
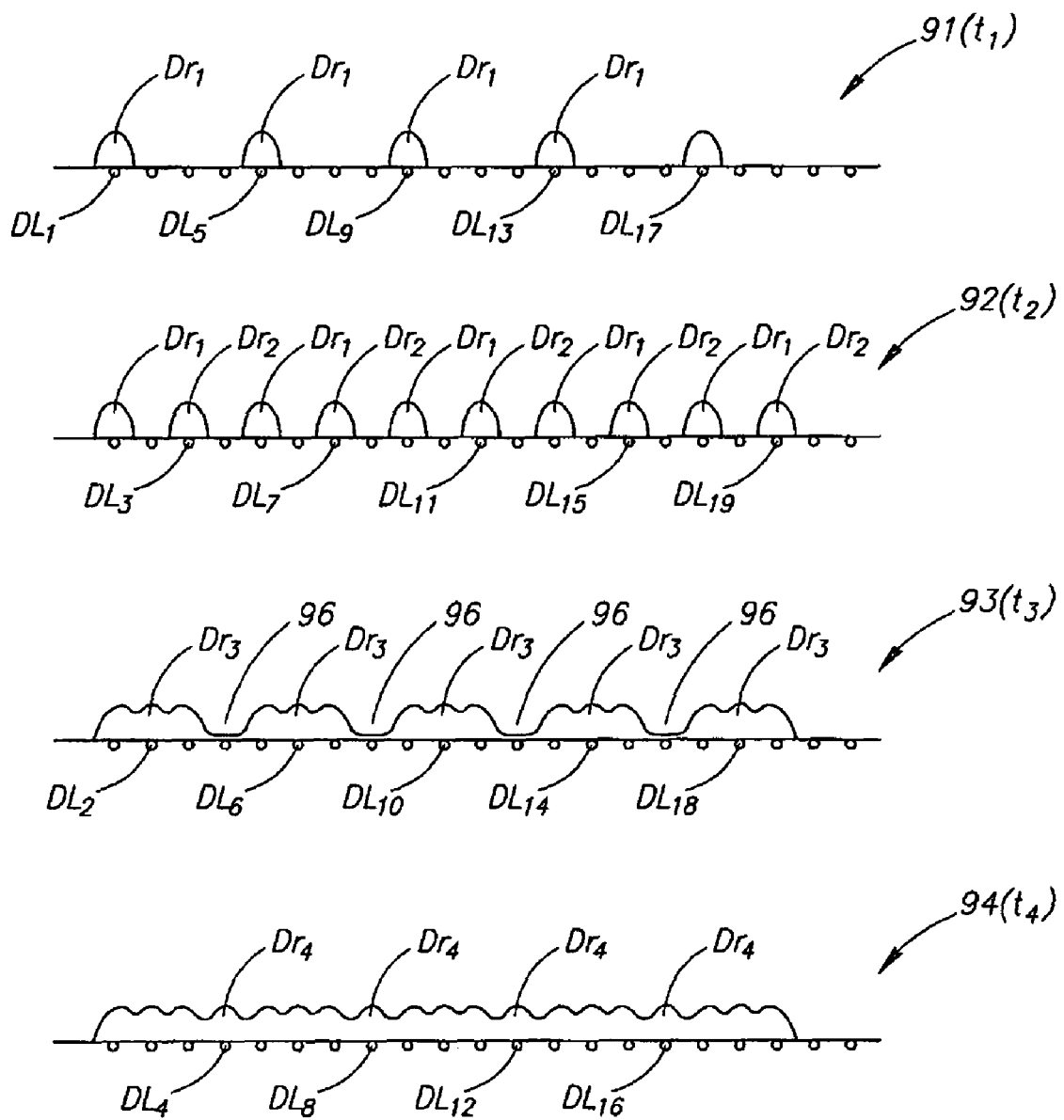
FIG. 4B schematically illustrates a method of dispensing construction material to produce a construction layer, in accordance with an embodiment of the present invention.

FIG. 4B schematically illustrates "equidistant" deposition of construction material to form a construction layer of an object, in accordance with an embodiment of the invention. The figure is similar to FIG. 4A and shows a sequence of schematic time-lapse cross section views 91, 92, 93 and 94. The cross section views are along a plane parallel to the xz plane at a given x-coordinate and illustrate deposition of droplets of construction material deposited at sequential times $t_1, t_2, t_3$ and $t_4$ along deposition lines in accordance with equidistant deposition.

At time $t_1$, in time-lapse view 91, droplets $Dr_1$ are deposited along deposition lines $DL_1, DL_5, DL_9 \ldots$. At time $t_2$, in time-lapse view 92, droplets $Dr_2$ are deposited on deposition lines $DL_2$, $DL_6$ ... not adjacent to droplets $Dr_1$ but equidistant between the droplets along deposition lines $DL_3$, $DL_5$ .... At time $t_3$, in time-lapse view 93, droplets $Dr_3$ are optionally deposited along deposition lines $DL_2$, $DL_4$ .... From times $t_1$ and $t_2$ to time $t_3$, material in droplets $Dr_1$ and $Dr_2$ respectively, spread. Spreading of droplets $Dr_1$ and $Dr_2$ is believed to partially fill regions 96 along deposition lines $DL_4$, $DL_8$, $DL_{12}$. As a result of the filling, when, in time-lapse view 94, droplets $Dr_4$ are deposited at time $t_4$ along deposition lines $DL_4$, $DL_8$, $DL_{12}$, lacunae are not formed along the deposition lines and striations are not formed.

Figure 4C:
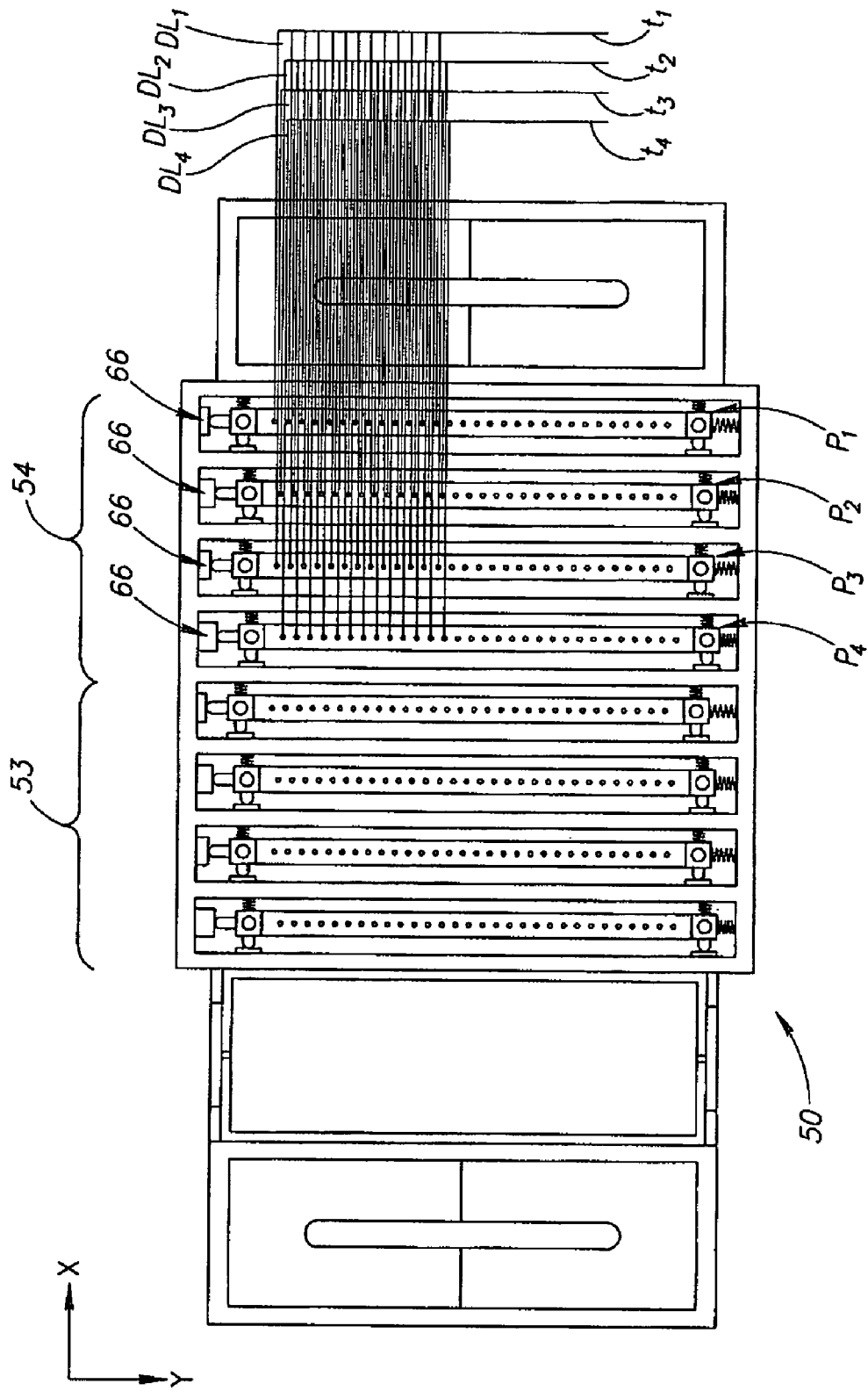
FIG. 4C schematically shows a shuttle configured to dispense construction material as illustrated in FIG. 4B, in accordance with an embodiment of the present invention.

FIG. 4C schematically shows a bottom view of printing head block 50 configured to implement equidistant deposition illustrated in FIG. 4B. The lengths of y alignment buttons 66 in sockets 54 (and optionally sockets 53) do not decrease linearly with increase in their x-coordinate relative to the x-coordinate of a feature of printing head block 50. As a result, printing heads $P_1$, $P_2$, $P_3$, $P_4$ do not deposit material along deposition lines $DL_1$, $DL_2$, $DL_3$ and $DL_4$ respectively as shown in FIGS. 3B and 4A. Instead, they are configured so that printing heads $P_1$, $P_2$, $P_3$, $P_4$ deposit material along deposition lines $DL_1$, $DL_3$, $DL_2$ and $DL_4$ respectively, as shown in FIG. 4B.

Whereas the alignment features comprised in printing head block 50 and printing heads 52 enable replacement of a printing head 52 in the printing head block without having to adjust or calibrate alignment of the printing head, a given printing head will, in general, be characterized by operating characteristics that axe peculiar to the printing head. To provide for proper operation of a given printing head 52, it is advantageous for controller 26 to control each printing head responsive to its peculiar operating characteristics. In accordance with an embodiment of the invention, each printing head 52 is profiled by profile data that characterizes operating parameters peculiar to the printing head. Optionally, as noted above profile data is stored in a memory 49, optionally comprised in the printing head's circuit board 55. When printing head 52 is mounted in a socket 51 data lines between controller 26 and printing head 52 over which the controller accesses the printing head's profile data are established via connectors 47 comprised in the circuit board.

Profile data that characterizes a printing head 52 may, for example, comprise operating data that specifies operation of each piezoelectric actuator comprised in the printing head that controls deposition of construction material via an output orifice 58 of the printing head. Typically, operating data for the actuator specifies actuator performance as a function of voltage applied to the actuator, identity and temperature of the construction material that printing head 52 dispenses. The data is generally used to determine rise time, fall time and amplitude of a voltage pulse that controller 26 applies to the actuator to control weight and/or ejection velocity of a drop of construction material dispensed through an orifice 58 with which the actuator communicates. Profile data optionally comprises operating characteristics of a heater optionally comprised in printing head 52, which heater controller 26 controls to maintain a desired temperature of construction material in the printing head reservoir.

Profile data may also comprise dimensional data for a printing head. For example, in some embodiments of the invention, lengths of x alignment pins 60 (FIG. 2D), while controlled so that the x pins on a same printing head 52 are a same length Δx to a high degree of accuracy, may vary by relatively large amounts from one printing head 52 to another. As a result, an a priori length of x pins 60 may not be known a priori for each printing head 52 to a degree of accuracy required for a desired resolution of RPA 20. For such embodiments, profile data for a printing head comprises data defining the lengths of its x alignment pins.

Whereas in the exemplary embodiment discussed above, optionally a memory 49 located on a printing head's circuit board 55 (FIG. 2D) comprises profile data for the printing head, in some embodiments of the invention profile data for a printing head 52 is comprised in a memory device separate from the printing head. For example, optionally a floppy disk, CD or portable flash memory comprises profile data for a printing head 52. The data is downloaded from the memory device to controller 26 using any of various methods and devices known in the art when the printing head is inserted into a socket 51 of printing head block 50 (FIGS. 2A-2C).

Figure 5:
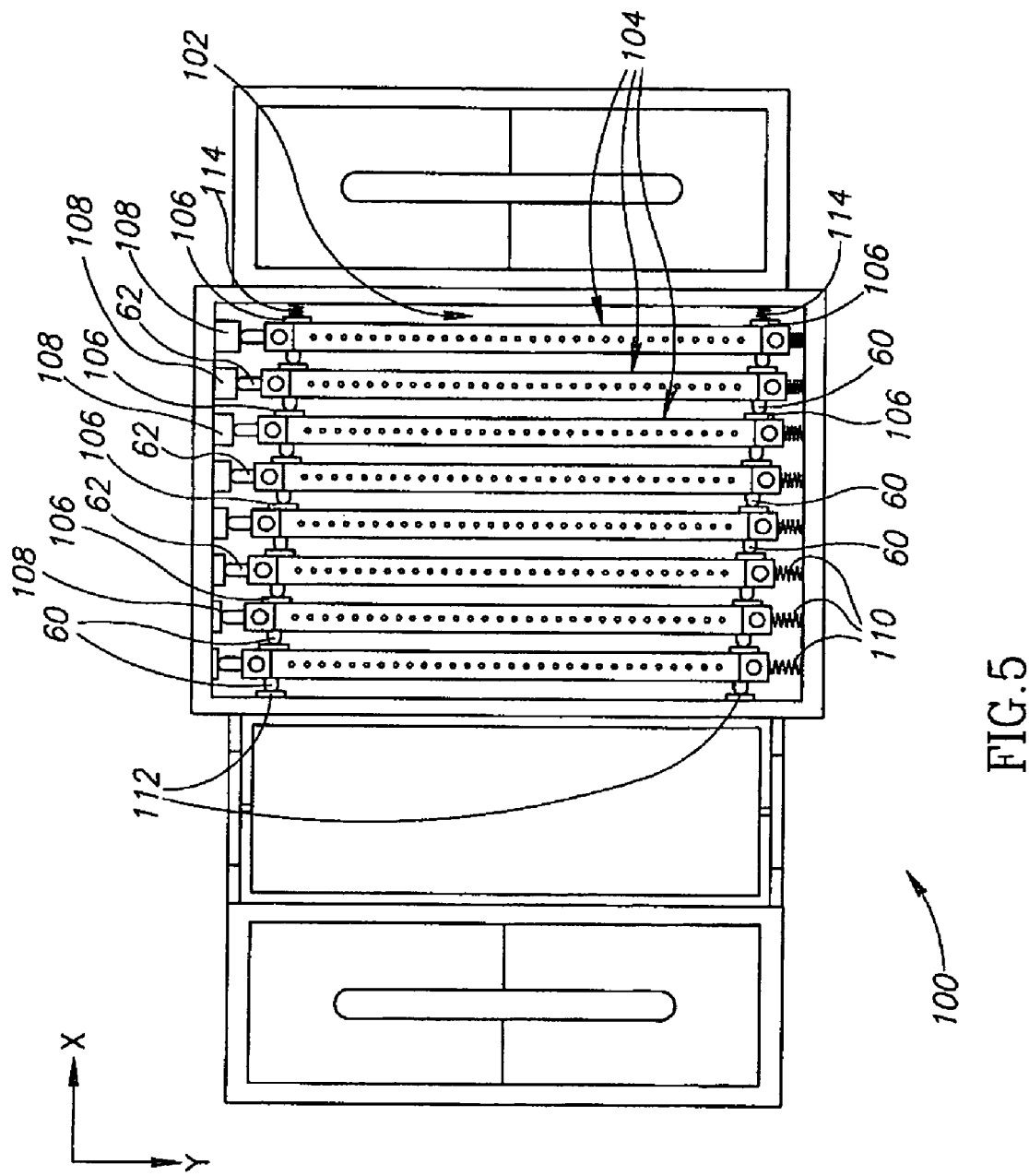
FIG. 5 schematically shows a bottom view of another shuttle, in accordance with an embodiment of the present invention.

In the above-described exemplary embodiment, printing heads 52 are inserted into individual sockets 51 in printing block head 50. In some embodiments of the invention a printing head block does not have sockets. FIG. 5 schematically shows a bottom view of a printing head block 100 that does not comprise individual sockets for each printing head mounted to the block, but instead comprises a single mounting cavity 102 for receiving printing heads 104.

Printing heads 104 are optionally identical and each is fitted with two x alignment pins 60 and a y alignment pin 62. In addition, each printing head 104 is fitted with two x alignment buttons 106. Mounting cavity 102 comprises y alignment buttons 108 and associated resilient elements 110 that correspond to y alignment pins 62 comprised in the printing heads 104 for, by way of example, eight printing heads 104. Lengths of y alignment buttons optionally increase linearly with increase in their x-coordinate relative to the x-coordinate of a feature in printing head block 100. Mounting cavity 102 also comprises two x alignment buttons 112 and corresponding resilient elements 114.

When eight printing heads 104 are inserted into mounting cavity 102, resilient elements 114 urge the printing heads one to the other along the x direction. As a result, x pins 60 of one printing head are pressed to x buttons 106 of a next printing head and the x pins of a last printing head press on x alignment buttons 114 in the cavity. Resilient elements 110 urge printing heads 104 so that their y pin press against y buttons in mounting cavity 102. The operation of the x and y alignment pins in printing heads 104 and corresponding x and y buttons and resilient elements in mounting cavity 102 operate to align the printing heads.

Each radiation lamp 120 (as shown for example in FIG. 2A) comprised in shuttle 28 optionally comprises a UV light bulb 122 that provides UV light for polymerizing construction material dispensed by printing heads 52, a reflector 124 and a housing 126 that supports and contains the reflector and bulb. UV light bulb 122 is optionally a discharge type bulb such as a Mercury or Xenon discharge bulb. Optionally, lamp 120 comprises a protective cover plate 128 that is transparent to UV light provided by bulb 122 and covers an aperture 129 of the lamp through which it provides light.

Figure 6A:
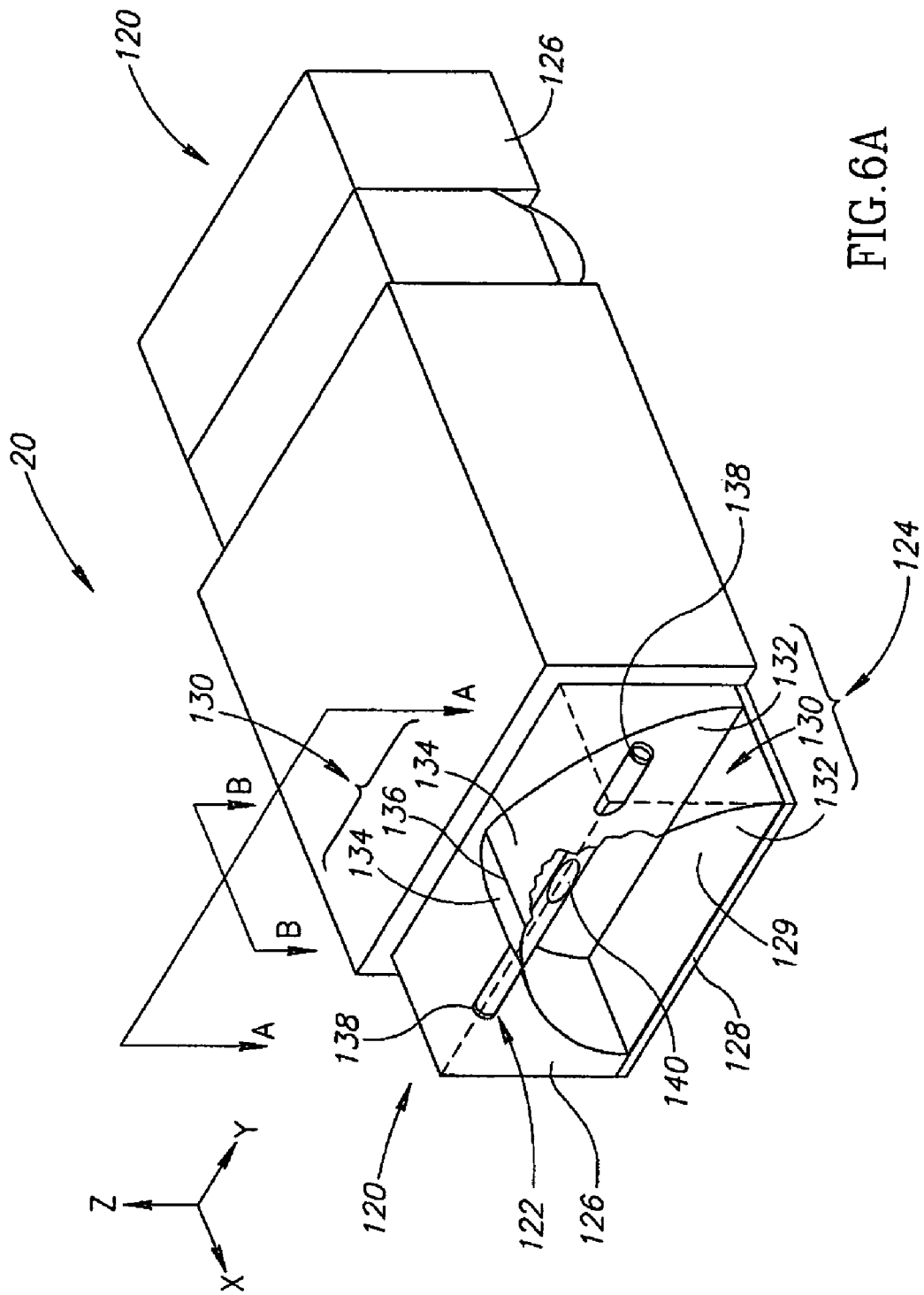
FIGS. 6A-6C schematically show a perspective partially cutaway view and cross sectional views respectively of a lamp that provides UV light for polymerizing construction material, in accordance with an embodiment of the invention.
Figure 6B:
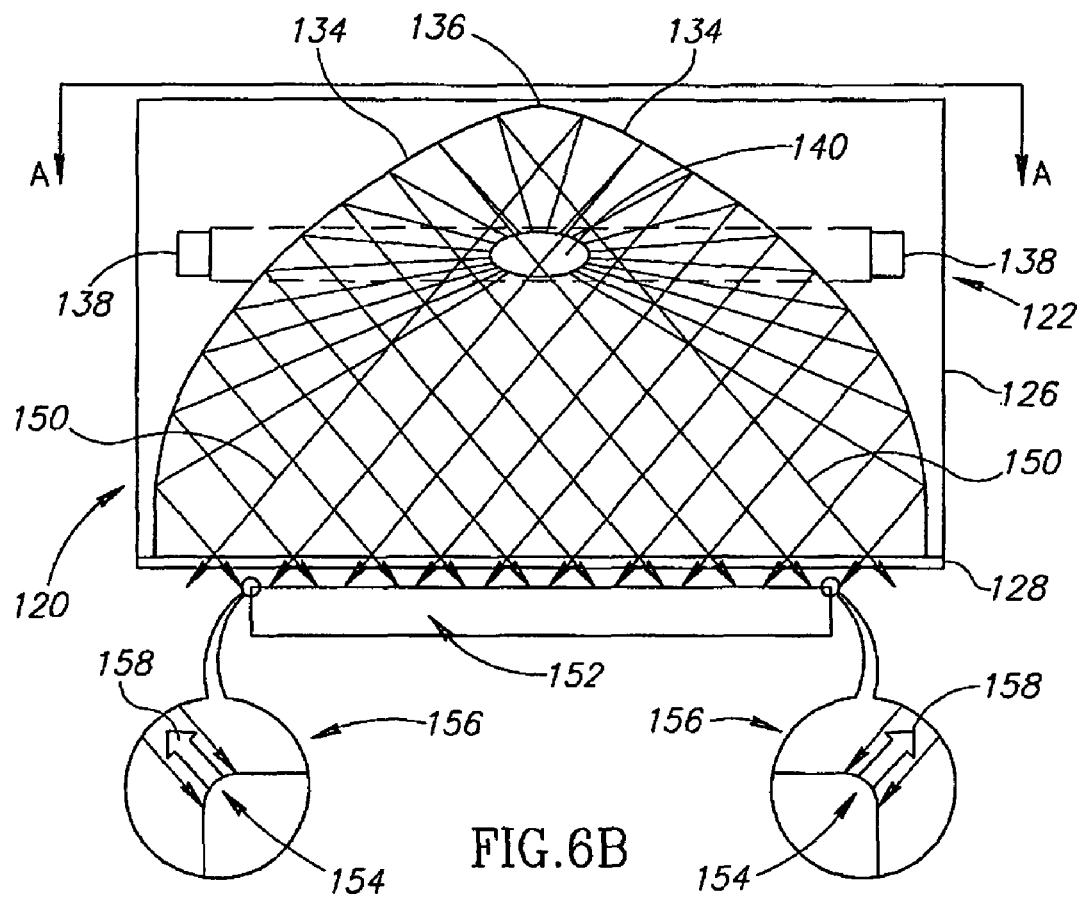
Figure 6C:
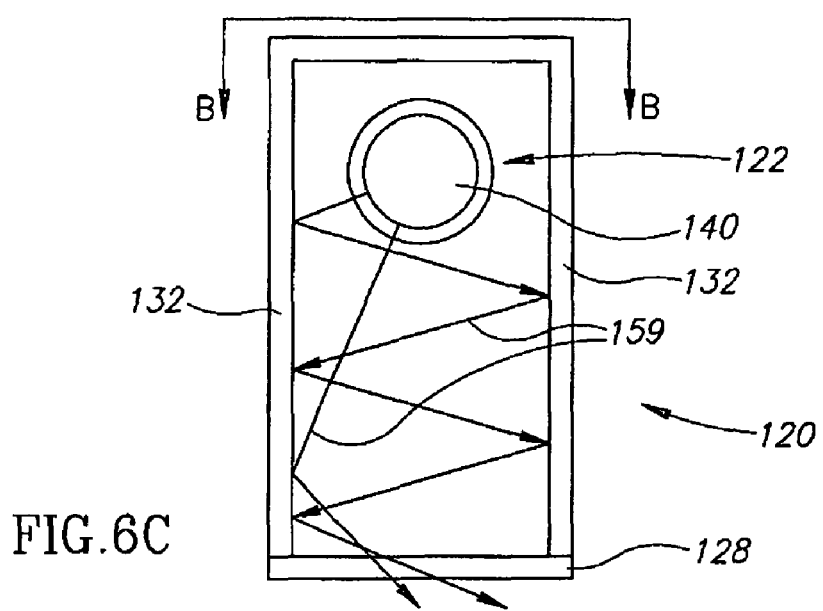

FIG. 6A schematically shows an enlarged view of shuttle 28, shown in FIG. 1, in which components of a lamp 120, in accordance with an embodiment of the invention, are shown as seen through housing 126 of the lamp, whose outline is indicated by dashed lines. In the figure reflector 124 is shown partially cutaway. FIGS. 6B and 6C show cross sectional views of lamp 120 in planes indicated by lines AA and BB.

UV light provided by lamp 120 that is reflected back to the printing heads 52 from a construction layer formed by RPA 20 and or surfaces of construction platform 24 (FIG. 1) may polymerize construction material on a printing head 52 (FIG. 2A) or other parts of shuttle 28. Polymerized construction material on a printing head 52 may block an output orifice 58 or orifices on the head. In addition, clumps of hardened or partially hardened construction material on a printing head 52 or other region of shuttle 28 may fall onto or collide with an object, such as object 22 (FIG. 1), that is being built by the RPA and damage the object.

Figure 6D:
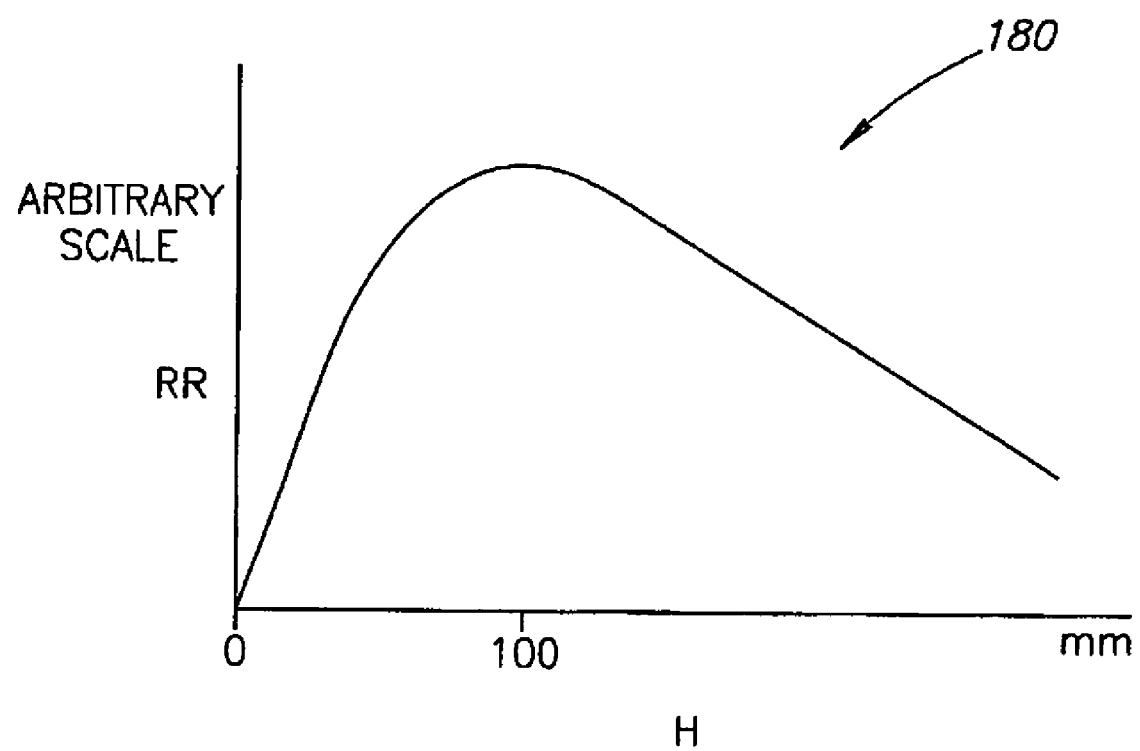
FIG. 6D shows a graph that graphs relative intensity of light from a UV lamp that is reflected from a construction layer being formed by the RPA shown in FIG. 1 as a function of height above the layer of the aperture through which the lamp provides the light.

The inventors have found that an amount of light reflected back from a construction layer to shuttle 28 is a function of a height above the construction layer and surface regions of construction platform 24 at which the lamp provides the light. The form of dependence of the amount of reflected light that reaches shuttle 28 as a function of height is similar to that shown in FIG. 6D in a graph 180, which graphs the amount of reflected light "RR" reaching the shuttle as a function of the height "H".

Whereas, the amount of reflected light is relatively small for relatively large as well as for relatively small values of H, it is of course advantageous to make H relatively small rather than relatively large in order to use light provided by lamp 120 efficiently. Therefore, in accordance with an embodiment of the invention lamps 120 are mounted to shuttle 28 so that in general during printing of construction layers by RPA 20 their respective apertures 129 are relatively close to the construction layers. In some embodiments of the invention, apertures 129 are less than about 10 mm from construction layers produced by RPA 20. In some embodiments of the invention apertures 129 are less than about 15 mm from construction layers produced by RPA 20. In some embodiments of the invention apertures 129 are less than about 10 mm from construction layers produced by RPA 20. In some embodiments of the invention apertures 129 are about 5 mm from construction layers produced by RPA 20.

A problem often encountered in the production of objects by a jet-ink RPA, such as RPA 20, is that it can be relatively difficult to provide the objects with sharply defined edges and features. Material along edges of a construction layer of an object produced by an RPA tends to "run" during production and, as a result, the edges tend to deform and lose definition. The inventors have determined that material along edge surfaces of a construction layer of an object tends to be relatively slowly and inefficiently polymerized and that this relatively slow and inefficient polymerization contributes to the poor definition of edges and fine detail in an object. In addition inefficient polymerization may also leave edges in the object unhardened and "sticky".

Inefficient, slow or partial polymerization of material along edge surfaces evidenced in an object produced by a prior art RPA appears to result from polymerizing light provided by lamps in the prior art RPA having relatively low intensity and being relatively strongly reflected from edge surfaces.

Increasing intensity of polymerizing light provided by a UV lamp does not in general alleviate the problem. Most of the material in the body of a construction layer of an object formed by an RPA is relatively rapidly polymerized at UV light intensities that are not sufficient to rapidly and effectively polymerize construction material along edge surfaces of the layer. Increasing intensity of the UV light is therefore wasteful of energy and most of the increase in intensity goes into heating material in the body of the layer that is already polymerized. The increased heating increases heat stress in components of the RPA and in the layer, tends to generate distortions in the layers and degrades accuracy with which the object is formed and quality of the object.

In accordance with an embodiment of the invention, to increase efficiency with which a UV lamp provides light that polymerizes construction material along edges of a construction layer without unduly wasting energy in undesired heating, the lamp provides light at relatively large angles to the normal to the plane of the construction layer. For a given intensity of light provided by the lamp, a ratio of intensity of light incident on edge surfaces of the layer to that incident on surfaces parallel to the plane of the layer increases as the angle of incidence increases. As a result, efficiency of polymerization of construction material along the edges increases relative to that of material in the body of the layer as the angle of incidence increases. A suitable angle of incidence and intensity of UV light can therefore be determined, in accordance with an embodiment of the invention, so that the light effectively polymerizes material in the edges as well as in the body of a construction layer without inordinate heating and waste of energy. Material in edges of construction layers produced by an RPA having a UV lamp in accordance with an embodiment of the invention is relatively efficiently polymerized. As a result the edges are not as susceptible to running and deformation as are edges of construction layers produced by prior art RPAs and tend to have improved definition.

By way of example, UV lamps 120 comprised in shuttle 28 provide a large part of their UV light output at angles of incidence equal, optionally, to about 45°. Optionally, reflector 124 in the UV lamps comprises an edge reflector 130 and optionally, planar reflectors 132, which are, optionally, surfaces of housing 126 that are treated so that they reflect light provided by bulb 122. Optionally, edge reflector 130 comprises two mirror image parabolic reflectors 134 that meet along a common edge 136 and are positioned so that their respective focal spots are substantially coincident. Radiation bulb 122 is optionally mounted to edge reflector 130 through suitable holes in the reflector. Contact ends 138 of bulb 122 are mounted to power sockets (not shown) comprised in housing 126 that provide electrical contact of bulb 122 to a power supply (not shown). Optionally, the sockets provide support for bulb 122 and maintain the bulb in position in housing 126.

Bulb 122 has a localized "hot spot" 140 from which most of the light provided by the bulb emanates and is positioned so that hot spot 140 is located substantially at the focal spots of parabolic reflectors 134. Each parabolic reflector 134 is positioned so that a relatively large portion of light that emanates from hot spot 140 is reflected substantially at an angle of about 45° to cover plate 128 through which the light exits lamp 120 and is incident on a construction layer being formed by RPA 20.

The cross sectional view of lamp 120 in FIG. 6B schematically shows parabolic reflectors 134 reflecting rays 150 of UV light from hot spot 140 so that the light exits the lamp through cover plate 128 at about 45° to the plane of the cover plate. The reflected light is incident on a region of a construction layer 152 produced by RPA 20. Layer 152 has edges 154 that are shown greatly magnified in insets 156. UV light that exits lamp 120 at about 45° to the plane of construction layer 152, in accordance with an embodiment of the invention, is incident on surface regions of edges 154 along directions that are relatively close to the directions of normals, indicated by block arrows 158, to the edge surfaces. As a result, relative intensity of light incident on surfaces of edges 154 is increased and a relatively large portion of the incident light penetrates into construction material along the edges and is effective in polymerizing the material.

FIG. 6C schematically shows planar reflectors 132 reflecting rays of light 159 from hot spot 140 so that they exit cover plate 128. To provide relatively intense light to polymerize material in a construction layer formed by RPA 20, optionally, planar mirrors are relatively close to each other so that light provided by bulb 122 that exits lamp 120 is concentrated on a relatively small surface region of the construction layer.

The inventors have determined that the relatively close planar reflectors contribute to reducing an amount of UV light provided by lamp 120 that is reflected towards orifices in printing heads comprised in shuttle 28.

Figure 7A:
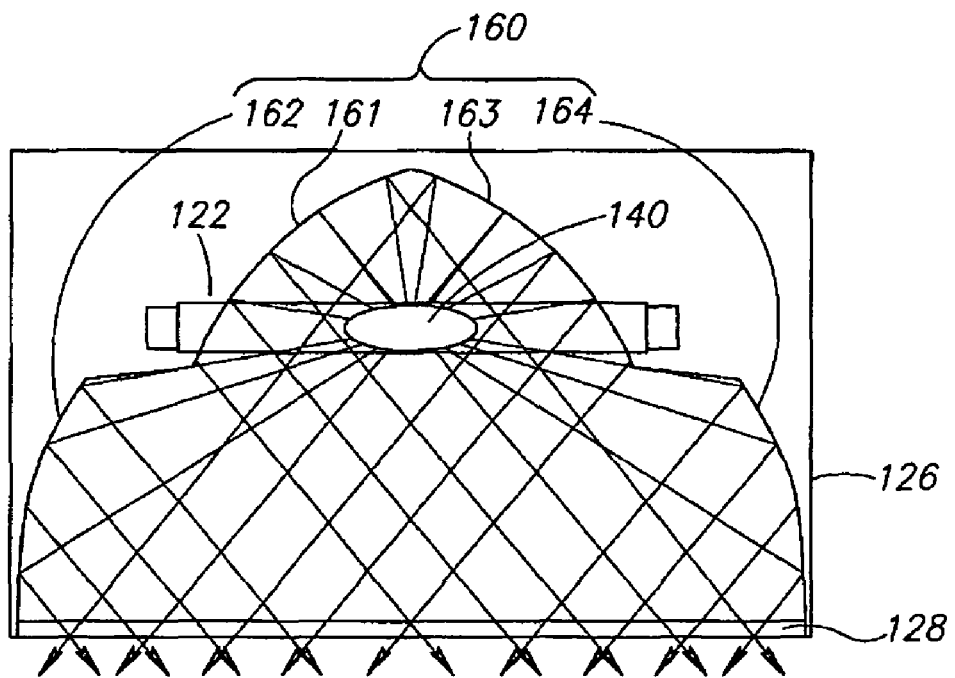
FIGS. 7A and 7B show schematic cross sectional views of other UV lamps, in accordance with embodiments of the present invention.
Figure 7B:
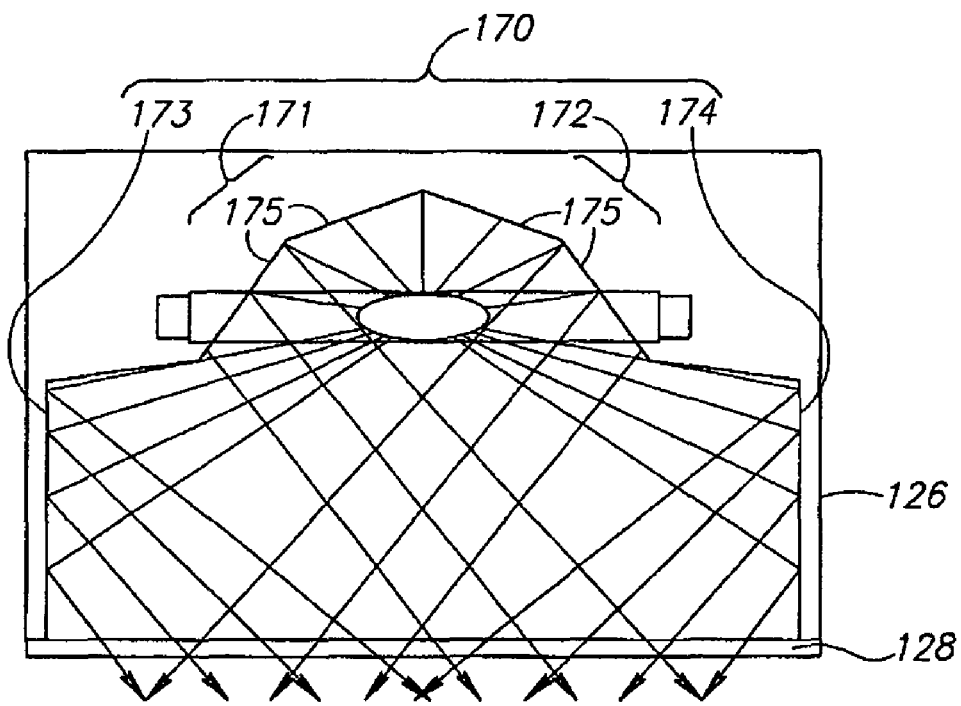

FIGS. 7A and 7B schematically show cross sectional views of variations of UV lamp 120. The cross sectional views are in the plane indicated by line AA shown in FIG. 6A and are similar to that shown in FIG. 6B. In FIG. 7A an edge reflector 160 in accordance with an embodiment of the invention and similar to edge reflector 124, comprises four parabolic reflectors 161, 162, 163 and 164. Parabolic reflectors 161 and 163 are mirror images of each other and parabolic reflectors 162 and 164 are mirror images of each other. Focal spots of all parabolic mirrors substantially coincide with hot spot 140 of bulb 122. In FIG. 7B an edge reflector 170, in accordance with an embodiment of the invention, similar to edge reflector 124, comprises two "prismatic" parabolic reflectors 171 and 172 and planar reflectors 173 and 174. Parabolic reflectors 171 and 172 are mirror images of each other and each comprises two planar panels 175. Planar reflectors 172 and 174 are mirror images of each other.

Discharge type bulbs, such as Hg and Xe discharge bulbs, that are conventionally used to provide UV light, generally require a high voltage power supply and cumbersome ignition system for their operation, generate relatively large amounts of heat and cannot be turned on and off rapidly.

In some embodiments of the invention UV lamps comprise LEDs that provide UV light for polymerizing construction material. UV LEDs generate relatively small amounts of thermal energy in comparison with the UV energy they deliver, can be turned on and off relatively rapidly and can provide UV radiation in a relatively small bandwidth of desired radiation. Output intensities of LEDs can be relatively easily controlled and they can be packaged in arrays sufficiently dense to provide UV light at intensities required for rapid polymerization of construction materials used by RPAs.

Turning the LEDs on and off is an immediate operation, not involving time delays or RF (radio frequency) interference radiation typical of operation of discharge type bulbs. The process of building an object starts quickly and the process itself is more reliable due to the aforesaid immediate on/off switching of the LEDs.

Furthermore, use of LEDs would decrease deformation of the printed model for a number of reasons, for example, a significant difference in temperature between the object (during the building process) and room temperature is a cause of deformation in the final printed object after cooling, especially when cooling is carried out fast and not evenly throughout the process. As LED arrays dissipate only a small amount of heat per curing quantity, the built object is processed in lower temperature conditions than when discharge lamps are used and thus the deformation liable to occur during cooling of the object is lessened.

Figure 8:
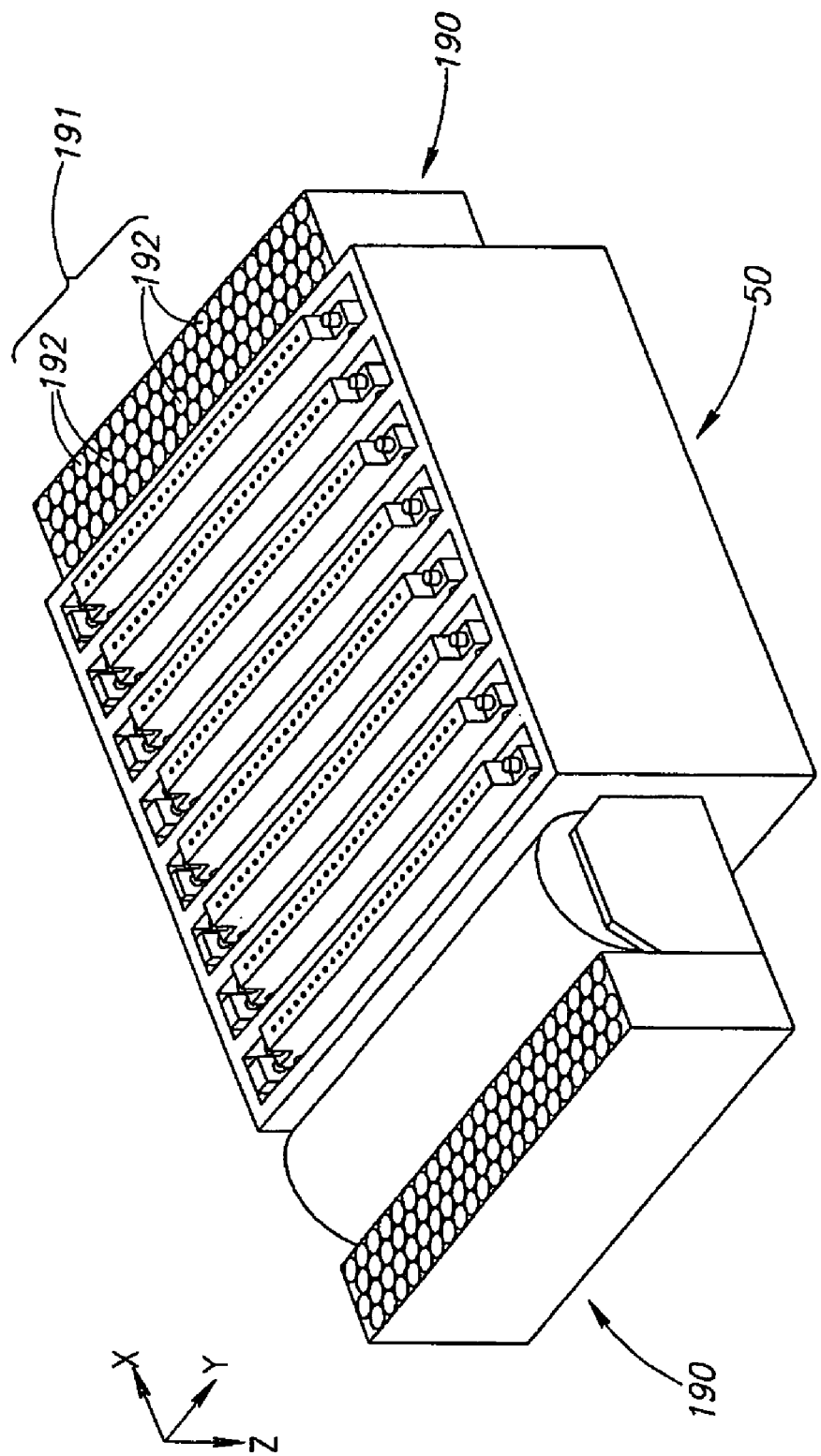
FIG. 8 schematically shows UV lamps comprising LEDs, for providing polymerizing UV light, in accordance with an embodiment of the present invention.

FIG. 8 schematically shows a shuttle 28 comprising UV lamps 190, each of which optionally comprises an optionally densely packed array 191 of LEDs 192 that provide UV light. Optionally, LEDs 192 are in DIE form (i.e. semiconductor dice, and in this case non-packaged LEDs) and are arrayed at a pitch of about 1 mm. Optionally, LEDS 192 are SMD LEDs, which may be configured in array 191 at a pitch less than 2 mm. To provide UV radiation that is incident at relatively large angle of incidence on regions of a construction layer formed by RPA 20, optionally, each LED 192 is coupled to a microlens using methods known in the art that shapes light provided by the LED into substantially a cone beam of light having a relatively wide cone angle. Optionally, the cone angle is larger than about 80° (full cone angle). Optionally, the cone angle is larger than about 100° (full cone angle). Optionally, controller 26 controls intensity of light provided by a UV LED 192 by controlling current or voltage supplied to the LED. Optionally, controller 26 delivers power to a LED 192 in the form of a train of current or voltage pulses and the controller controls a duty cycle of the pulse to control intensity of UV light from the LED.

In accordance with an embodiment of the invention, controller 26 (FIG. 1) that controls operation of shuttle 28 controls intensities of UV light provided by LEDs 192 in array 191 independently of intensities provided by other LEDs in the array. In particular, the controller controls individual LEDs 192 so as to limit UV radiation that lamp 190 provides to where and when it is needed. For example, as a construction layer 34 is printed, the layer may have non-printed regions where construction material is not deposited. Optionally, controller 26 controls LEDs 192 so that the non-printed regions receive relatively little or substantially no UV light. During production of an object, such as object 22, as noted above, controller 26 periodically initiates a maintenance procedure and moves shuttle 28 away from construction platform 24 to maintenance areas 200 for cleaning. For duration of the maintenance procedure, controller 26 optionally shuts off LEDs 192.

Whereas LEDs 192 generate relatively little heat, they and/or circuitry associated with the LEDs do generate heat, and in a densely packed array, it can be advantageous to provide lamps 190 with features to enhance heat dissipation. In some embodiments of the invention, LEDs 192 are mounted to appropriate heat sinks and/or coupled to Peltier devices, and/or are provided with suitable fans for enhancing heat dissipation.

In some embodiments of the invention, an RPA similar to RPA 20, in accordance with an embodiment of the invention comprises a shuttle in which LEDs are positioned relatively far from construction layers that the RPA produces. UV light form the LEDs are piped to the construction layers by light pipes or optical fibers.

Figure 9A:
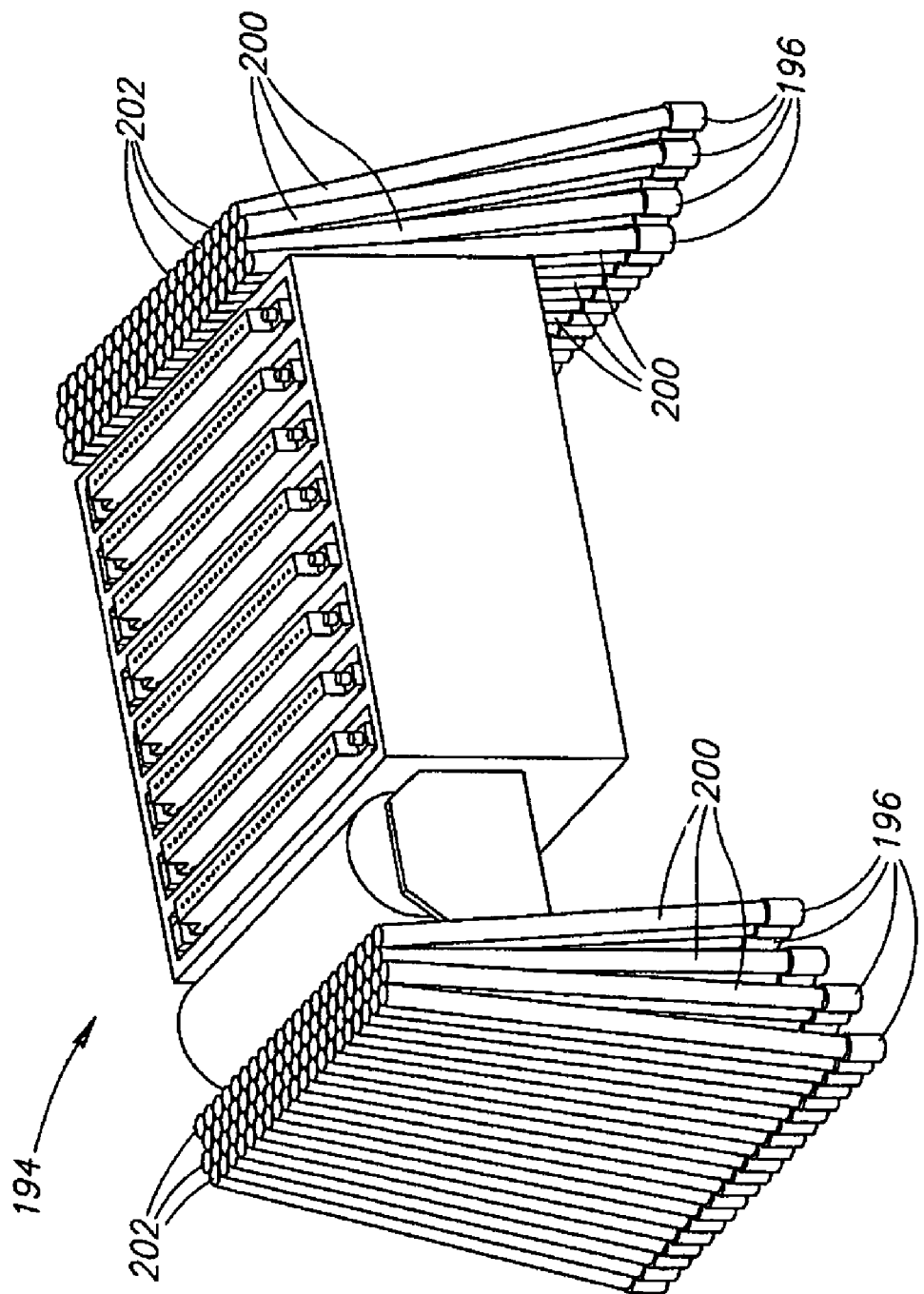
FIGS. 9A and 9B schematically show perspective views of a shuttle having UV lamps that comprise LEDs that are located relatively far from construction layers that the shuttle is controlled to form, in accordance with an embodiment of the present invention.
Figure 9B:
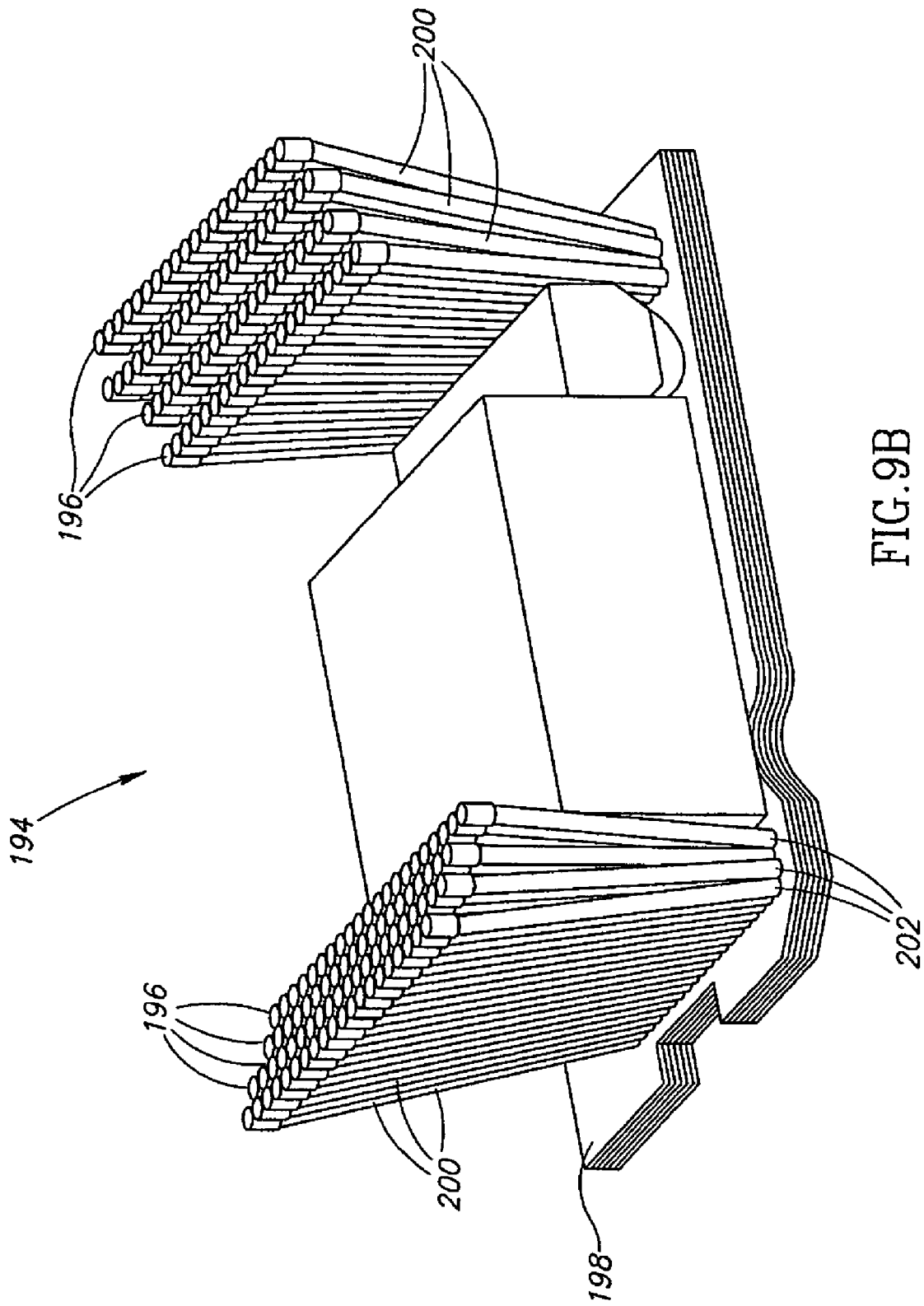

FIGS. 9A and 9B schematically show perspective views of a shuttle 194 comprising LEDs 196 that are positioned relatively far from construction layers that the shuttle prints. FIG. 9A shows a perspective view of shuttle 194 from the bottom. FIG. 9B shows a perspective view of the shuttle "right side up" and a construction layer 198. LEDs 196 are coupled to optic fibers or light pipes 200 that pipe light from the LEDs to the construction layer. UV light from LEDs 196 exit light pipes 200 via ends 202, which are supported by a suitable support structure or housing (not shown) in close proximity to construction layer 198 (FIG. 9B). Optionally, ends 202 are coupled to or formed with a suitable lens so that UV light exits in a cone of light having a relatively large cone angle. LEDs 196 and optionally circuitry associated with the LEDs are supported or mounted in a housing (not shown) in a relatively "open" configuration to enhance heat dissipation.

As noted above, periodically during production of an object, controller 26 moves shuttle 28 to maintenance area 220 (FIG. 1) and performs a cleaning procedure. The cleaning procedure generally comprise a purging procedure in which construction material is released form all orifice at one to refresh the flow of material through the printing head. Controller 26 then controls shuttle 28 to contact an edge of at least one of first cleaning blade 225 and second cleaning blade 227 and move in a direction substantially perpendicular to the edge so that the cleaning blade wipes away residual droplets of material remaining on the orifice surface after purging as well as excess construction material "debris" and dirt that accumulates on surfaces of printing heads 52 during production.

Figure 10A:
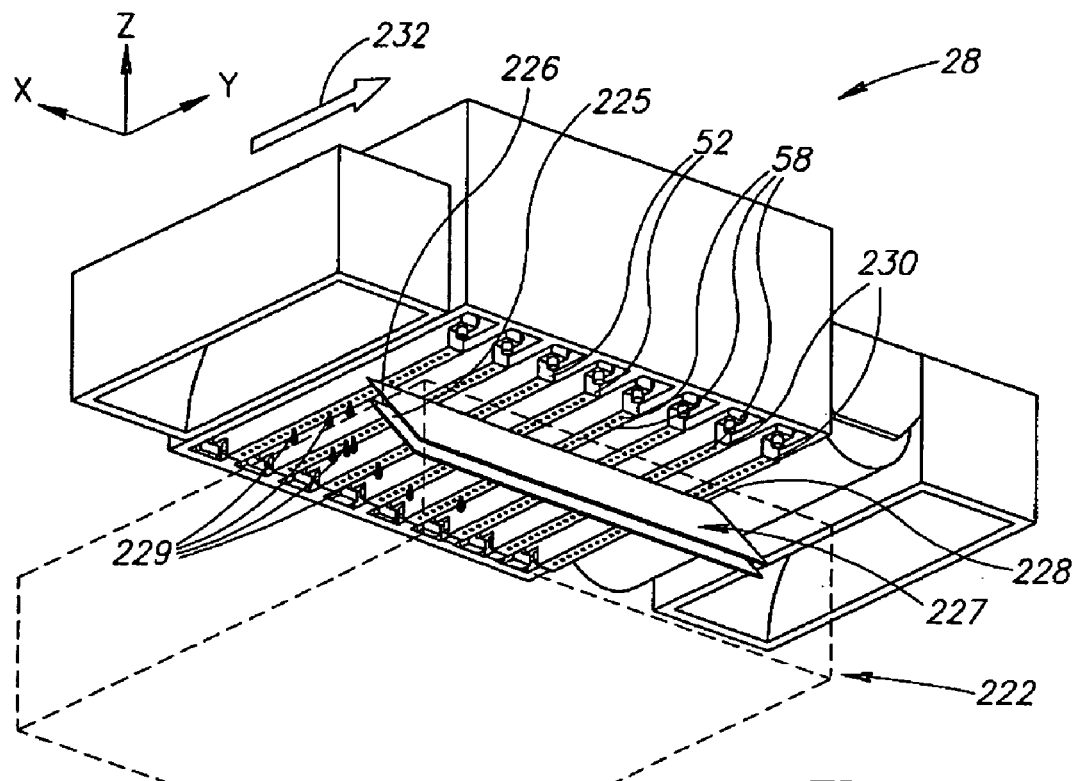
FIGS. 10A and 10B schematically show a perspective and cross sectional view respectively of a shuttle undergoing maintenance cleaning in accordance with an embodiment of the invention.
Figure 10B:
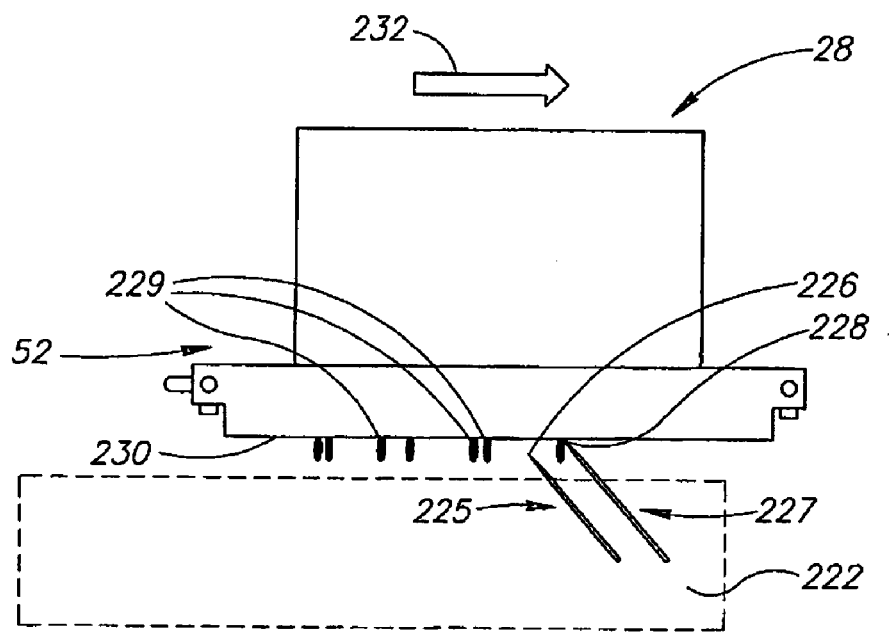

FIGS. 10A and 10B schematically show an enlarged perspective view and cross section view respectively of the bottom of shuttle 28 during a cleaning procedure in accordance with an embodiment of the invention. The figure shows cleaning blades 225 and 227 removing construction material debris 229 from and wiping clean, surfaces, hereinafter "orifice surfaces" 230, of printing heads 52 in which output orifices 58 are located.

Cleaning blades 225 and 227 have "cleaning" edges 226 and 228 respectively that are optionally parallel to each other and to the x axis. Optionally, cleaning edge 226 of first cleaning blade 225 is close to but displaced from and does not contact orifice surfaces 230. Cleaning edge 228 of second cleaning blade 227 contacts orifice surfaces 230. Shuttle 28 moves parallel to the y-axis in a direction indicated by a block arrow 232. As shuttle 28 moves, edge 226 of first cleaning blade 225 removes relatively large accumulations of debris that protrude substantially from orifice surfaces 232. Edge 228 of second cleaning blade 227 removes remaining debris and scrapes the surfaces clean.

Debris 229 removed from the surfaces of printing heads 52 by cleaning blades 225 and 227 falls or drips into sump 222 shown in dashed lines. A sufficient distance separates first and second wiping blades 225 and 227 so that debris removed from orifice surfaces 230 by cleaning edges 226 and 228 of the blades is not hindered from dripping or falling into sump 222. A suitable vacuum pump (not shown) removes debris accumulated in sump 222 during maintenance procedures.

The inventors have found that by using two cleaning blades a pre-wiper, i.e. first cleaning blade 225, that does not quite contact surfaces 230 of printing heads 52 and a scraper, i.e. second cleaning blade 227, that contacts and scrapes the surfaces, a tendency of debris to accumulate between the printing heads during cleaning is reduced.

Figure 10C:
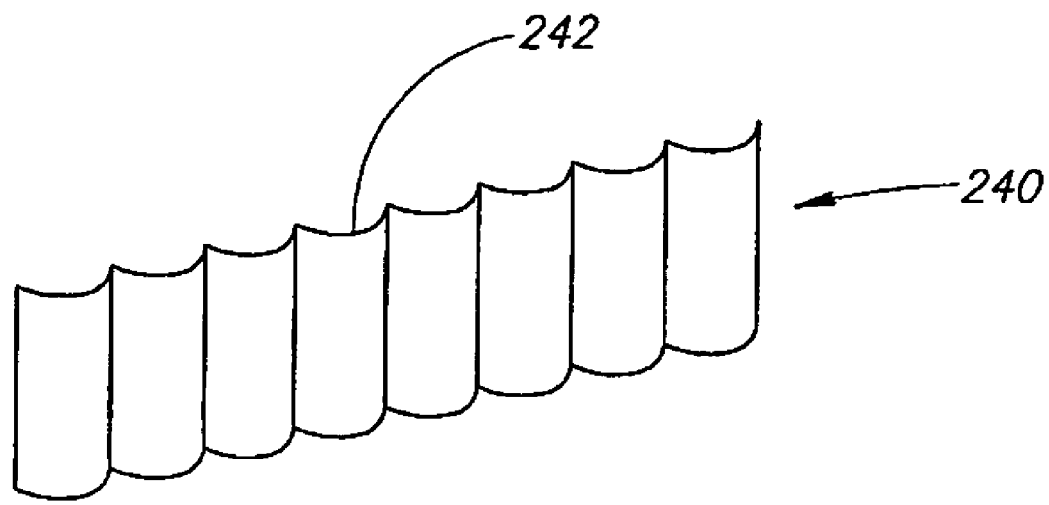
FIGS. 10C-10D schematically show variations of cleaning blades used to clean a shuttle, in accordance with an embodiment of the invention.

In some embodiments of the invention, edges of cleaning blades are not straight but have a crenulated or scalloped shape. FIG. 10C schematically shows a cleaning blade 240 having a scalloped a edge 242. A straight cleaning blade edge tends to push portions of debris that the blade scrapes from printing heads 52 laterally along the blade edge. Debris that is forced along the edge has a tendency to get caught and accumulate in spaces between the printing heads. A scalloped edge tends to prevent lateral movement of removed debris and direct the debris downward to sump 222.

Figure 10D:
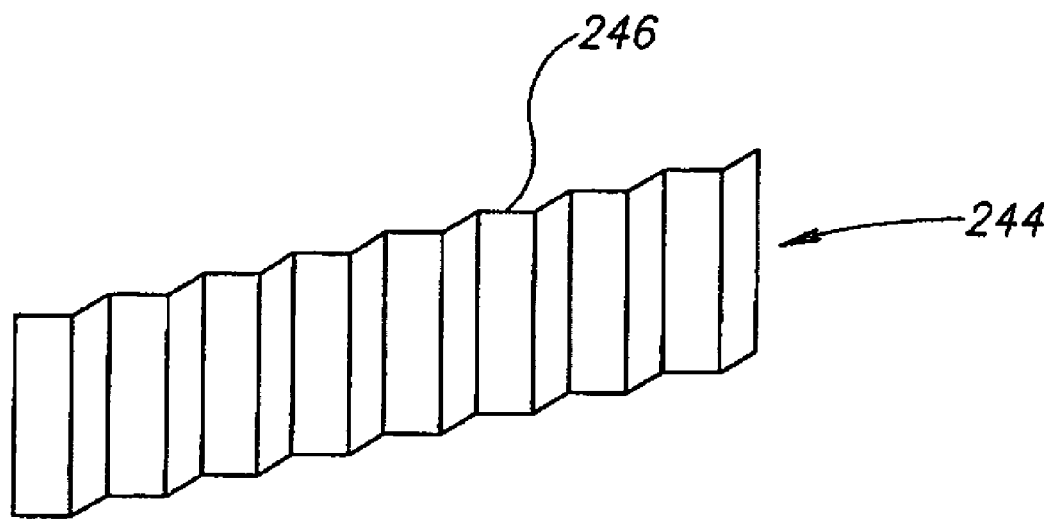

A scalloped edge is not the only shaped edge that functions to prevent lateral movement of debris along the edge. FIG. 10D schematically shows a cleaning blade 244 having an edge 246 shaped like a train of triangular pulses, which for example, will perform similarly.

Figure 11A:
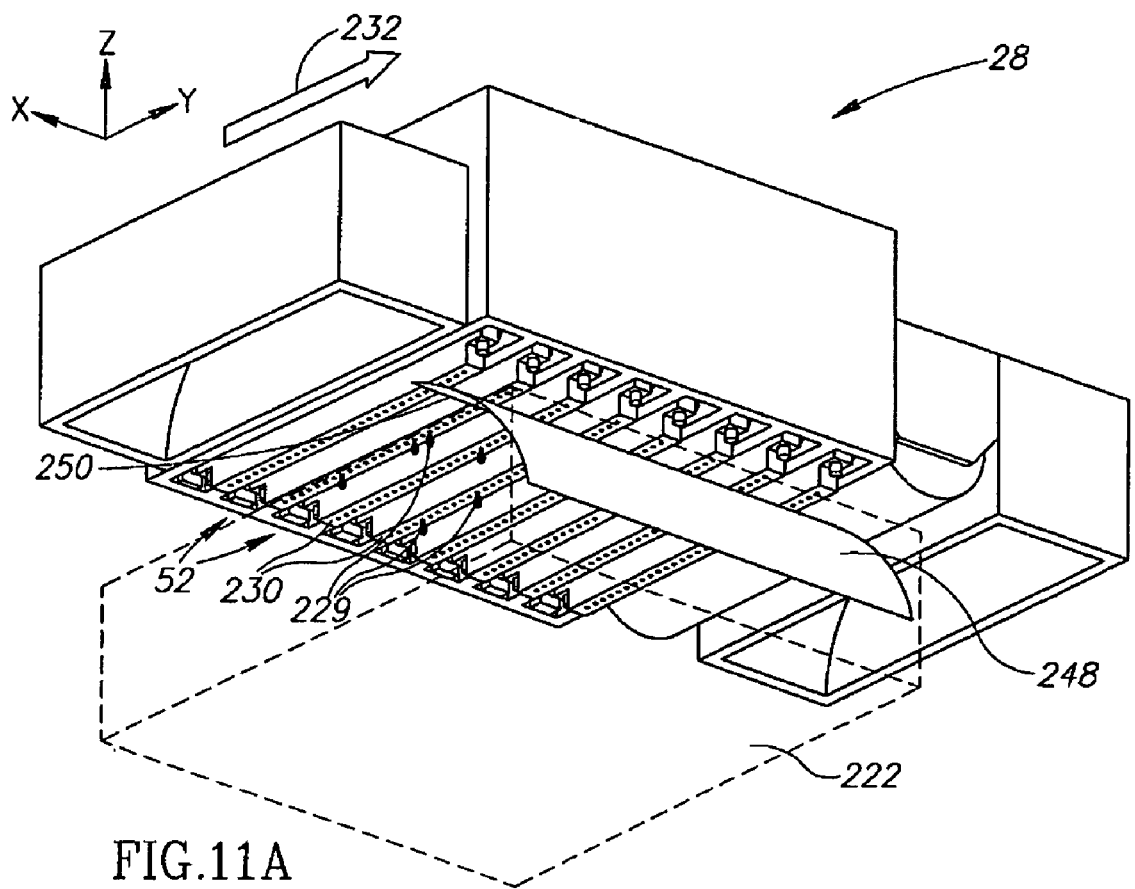
FIGS. 11A and 11B schematically show perspective and cross section views of another cleaning blade configuration, in accordance with an embodiment of the invention.
Figure 11B:
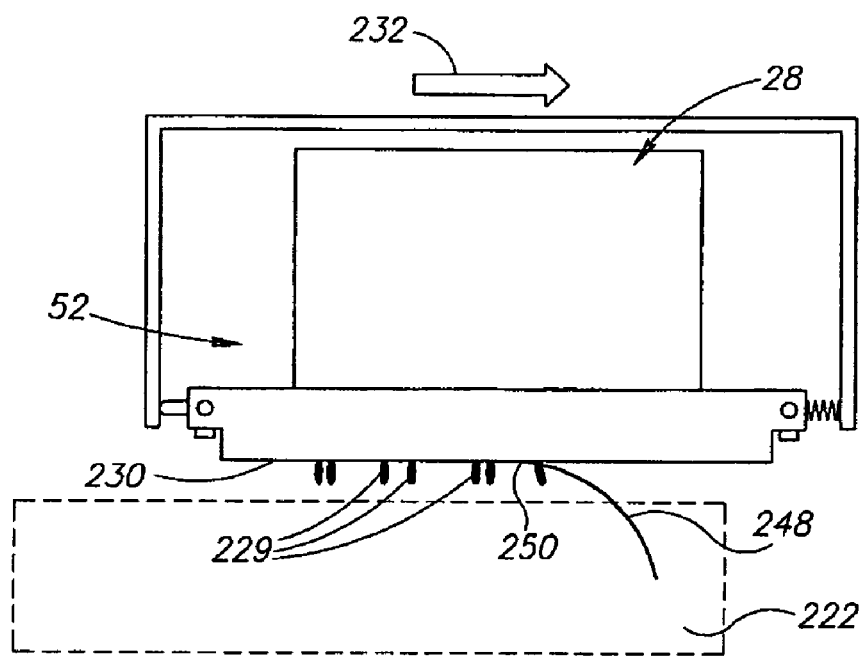

In some embodiments of the invention, cleaning area 220 (FIG. 1) comprises a single cleaning blade. FIGS. 11A and 11B schematically show perspective and cross section views respectively of shuttle 28 undergoing maintenance cleaning during which, optionally, a single cleaning blade 248 cleans orifice surfaces 230 of printing heads 52.

Cleaning blade 248 comprises a thin elastic blade optionally formed from plastic, rubber or metal. Optionally, cleaning blade 248 is formed from a thin sheet of steel about 50 microns thick. Cleaning blade 248 is mounted over sump 222 so that it is angled with respect to surfaces 230 of punting heads 52. During cleaning, controller 26 (FIG. 1) positions shuttle 28 so that surfaces 230 (FIG. 11B) press down on cleaning blade 248 causing the blade to contact the surfaces at an acute angle and a cleaning edge 250 of the blade to press resiliently to the surfaces. As shuttle 28 moves in the direction of block arrow 232, cleaning edge 250 efficiently scrapes debris 229 off surfaces 230 so that it drips and/or falls into sump 222.

Figure 11C:
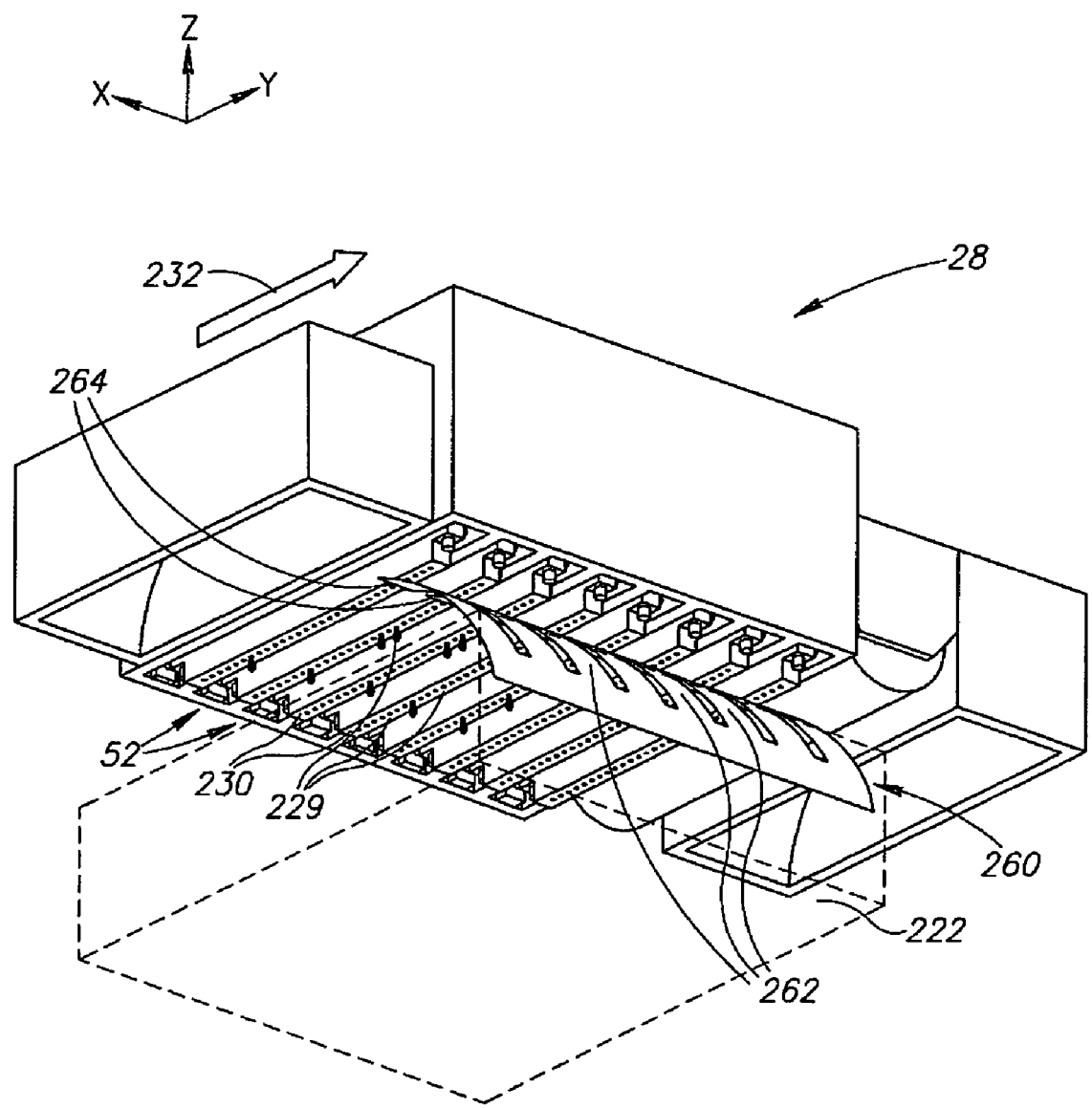
FIG. 11C schematically shows a perspective view of a variation of the cleaning blade shown in FIGS. 11A and 11B, in accordance with an embodiment of the invention.

In some embodiments of the invention, a cleaning blade similar to cleaning blade 248, in accordance with an embodiment of the invention, is slotted so that it comprises a plurality of individually flexible teeth. FIG. 11C schematically shows a slotted cleaning blade 260, in accordance with an embodiment of the invention, cleaning shuttle 28. Cleaning blade 260 comprises a plurality of teeth 262 having cleaning edges 264. During cleaning each tooth 262 contacts a surface 230 of a different printing head 52 at an acute angle and an edge 264 of the tooth presses resiliently to the surface. Since each tooth 262 is flexible substantially independently of the other teeth, each tooth 262 adjusts to the height, i.e. the z-coordinate, of surface 230 of the printing head 52 that it cleans independently of the other teeth. Cleaning blade 260 is therefore able to compensate efficiently to slight differences in the heights of surfaces 230.

It is noted that slotting, in accordance with an embodiment of the invention, is not advantageous only for blades that function like blades 248 and 260. Cleaning blades similar to blades 225 and 227 (FIG. 10A) and blades 242 and 246 may also be slotted so that in effect each blade comprises a plurality of small cleaning blades (i.e. teeth), each of which cleans a different printing head 52 and adjusts substantially independently to differences in heights of surfaces 230 of the heads.

Despite implementation of regular maintenance cleaning of printing heads 52, during construction of an object, construction material debris may fall on a construction layer, or during leveling of a construction layer, the layer may be damaged, leaving it, in either case with unwanted protuberances. For such situations, not only may protuberances in the layer damage quality of a next layer to be deposited on the damaged layer, but as shuttle 28 moves over the construction layer it may collide with the protuberance and be damaged.

Therefore, an RPA, in accordance with an embodiment of the invention, such as RPA 20, optionally comprises an obstacle detection system. The detection system generates signals responsive to unwanted protuberances that may be formed on a construction layer and transmits the signals to controller 26. The controller either undertakes corrective action, such as attempting to level the layer using leveling roller 27, or stops production of the object and generates an alarm indicating that user intervention is required.

Figure 12A:
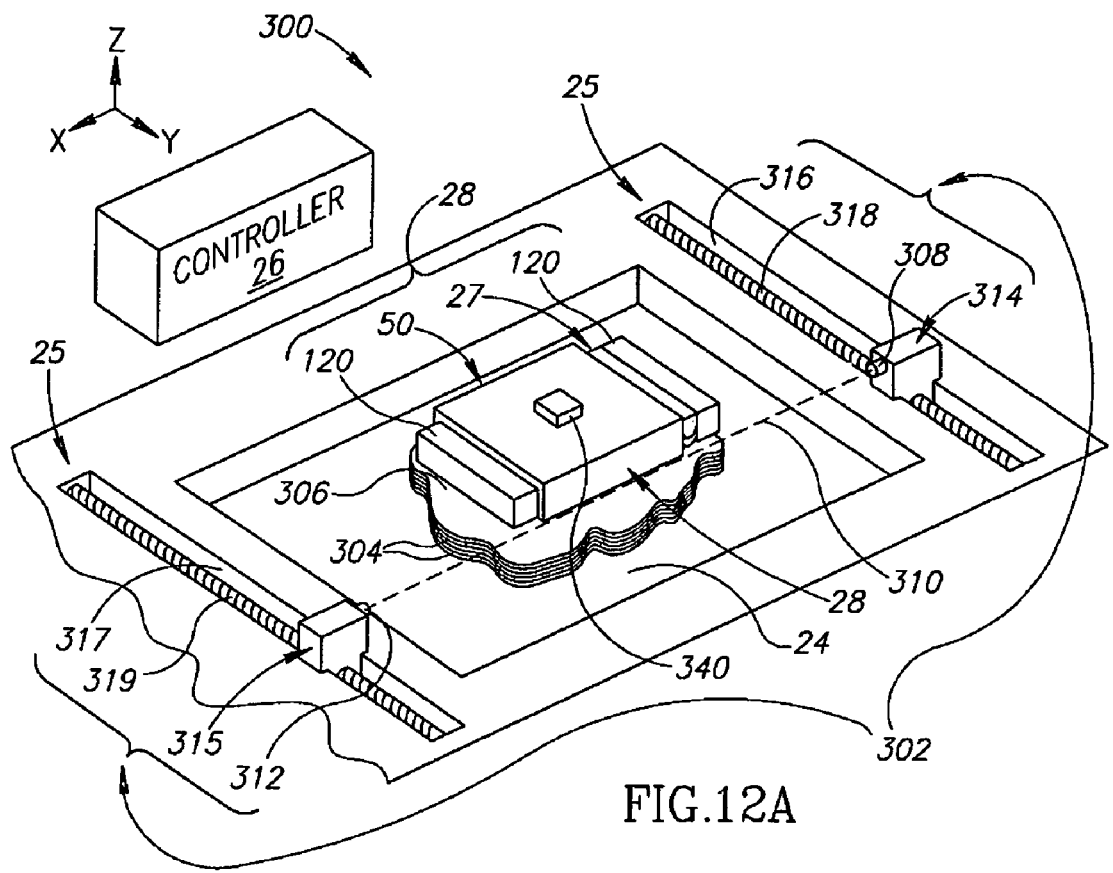
FIG. 12A schematically shows a system for detecting protuberances on a construction layer formed by an RPA, in accordance with an embodiment of the present invention.
Figure 12B:
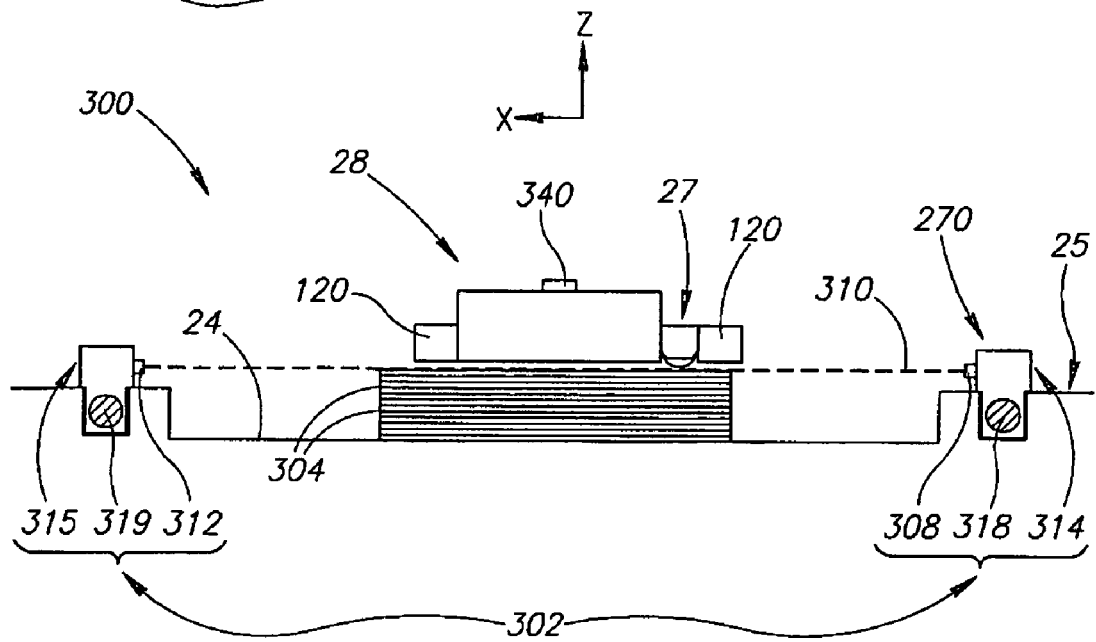
FIGS. 12B and 12C show schematic cross sections of the system shown in FIG. 12A.

FIGS. 12A and 12B schematically show a perspective view and a cross section view respectively of an RPA 300 similar to RPA 20 and comprising an obstacle detection system 302, in accordance with an embodiment of the invention. Only components and features of RPA 300 germane to the discussion are shown in FIGS. 12A and 12B. In the figures, RPA 300 is shown forming layers 304 of construction material during production of an object (not shown) and detecting protuberances in a top construction layer 306.

Obstacle detection system 302 optionally comprises a laser 308 and associated optics as required (not shown), controllable by controller 26 to provide, optionally, a pencil beam 310 of laser light. The detection system comprises an optical detector 312, and associated optics as required (not shown), for detecting light provided by laser 308. Optionally, laser 308 and detector 312 are mounted to carriages 314 and 315 respectively that sit in slots 316 and 317 formed in working table 25. Carriages 314 and 315 are optionally mounted to threaded shafts 318 and 319 located in slots 316 and 317 respectively. The slots are optionally parallel to the y-axis.

Controller 26 controls at least one motor (not shown) to rotate shafts 318 and 319 and position carriages 314 and 315 at desired locations along their respective slots 316 and 317 and thereby at desired y-coordinates. Optionally, laser 308 and detector 312 are controllable by controller 26 to be raised and lowered in directions perpendicular to worktable 25 (i.e. parallel the z-axis).

Figure 12C:
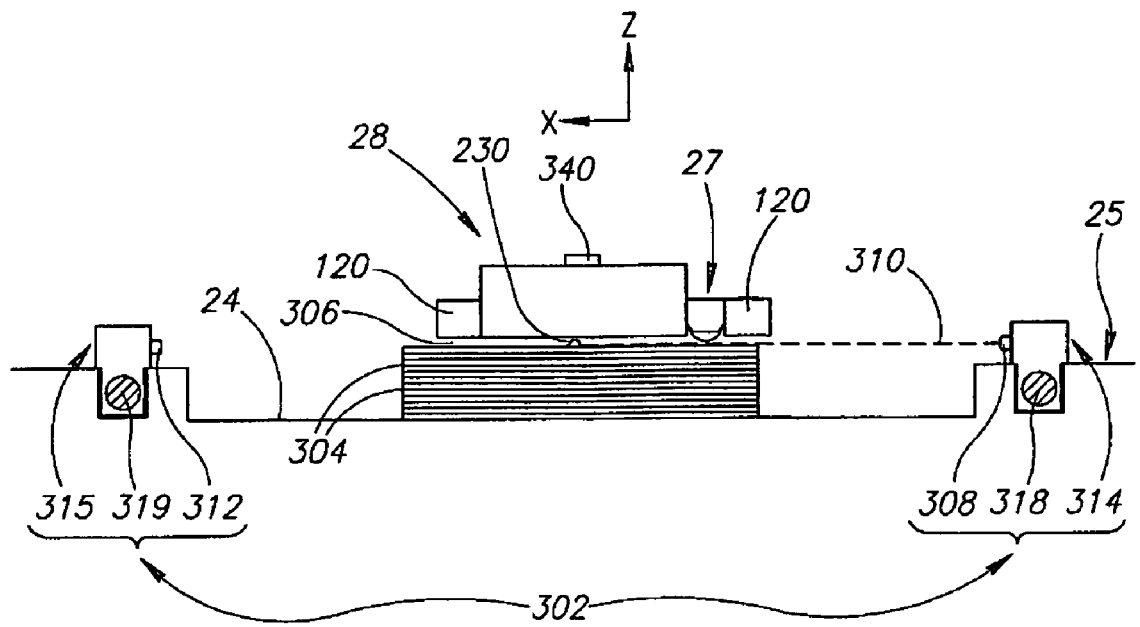

To detect protuberances in top construction layer 306, controller 26 positions laser beam 10 so that it contacts the surface of the layer along a length of the laser beam and moves carriage 314 along slot 316 so that, as it moves, protuberances that may be present in the layer at least partially block light in the laser beam. As controller 26 moves laser 308 it moves detector 312 to detect light from the pencil beam 10. Signals generated by detector 312 responsive to light in beam 10 indicate if and when the beam is blocked and thereby presence of a protuberance. FIG. 12C schematically shows laser beam being blocked by a protuberance 320. Optionally, controller 26 moves laser 308 and detector 312 so that pencil beam 10 precedes shuttle 28 as it moves along the y-axis and "scans" a region of top layer 306 for protuberances just before printing heads in the shuttle overprint the region with construction material for a next construction layer.

It is noted that for the configuration of obstacle detection system 302 shown in FIGS. 12A and 12B, motion of laser 308 and detector 312 are limited along the z-axis. The limitation does not affect ability of detection system 302 to detect protuberances in a top construction layer because it has been assumed for RPA 300, as for RPA 20, that for each new construction layer, construction platform 24 is lowered by substantially a layer thickness. As a result, all construction layers produced by RPA 300 are produced at substantially a same height above worktable 25, i.e. at a same z-coordinate, or at heights above the worktable within a same small range of heights.

However, in some RPAs in accordance with embodiments of the invention construction layers are not all produced at a substantially same z-coordinate. Instead the RPA's shuttle is raised by a layer thickness for each construction layer of at least some new layers that the RPA produces. For such embodiments, it can be advantageous, if not necessary, for an obstacle detection system to have a dynamic range along the z-axis substantially larger than that of detection system 302. An obstacle detection system, in accordance with an embodiment of the invention, can of course, where required or advantageous, be provided so that it has a substantially larger dynamic range along the z-axis than that of detection system 302.

Figure 12D:
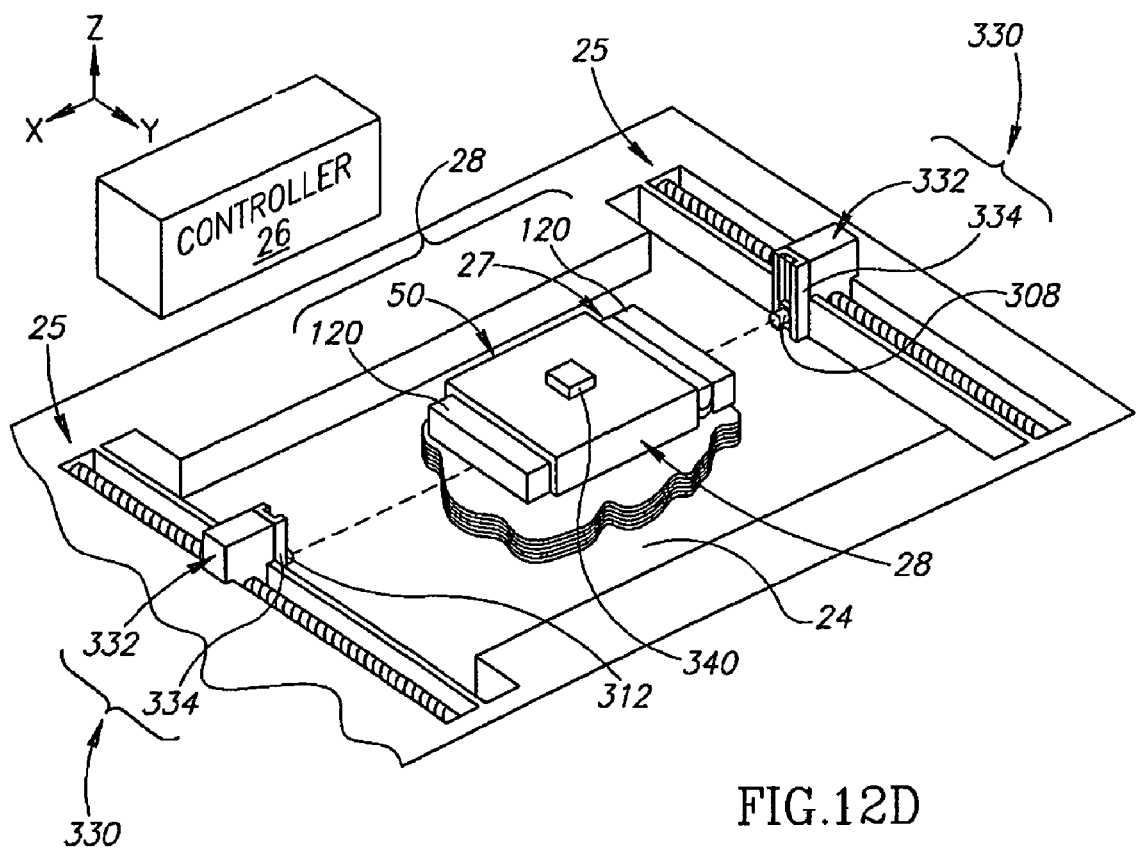
FIG. 12D schematically shows a variation of the system shown in FIG. 12A, in accordance with an embodiment of the present invention.

FIG. 12D schematically shows an obstacle detection system 330 in accordance with an embodiment of the invention, which is a variation of system 300. Obstacle detection system 330 has a dynamic range along the z-axis substantially larger than that of system 302. Detection system 330 optionally comprises carriages 332 each having a slider 334 controllable to be raised and lowered. A laser 308 and detector 312 are mounted to sliders 334 in different carriages 332 and are optionally controllable to be positioned at different locations along slider's length in the z-direction. A dynamic range for positioning laser 308 and detector 312 is substantially equal to a dynamic range of motion of sliders 334 in the z-direction plus substantially an extent of the sliders in the z-direction. Alternatively, by way of another example, a laser and detector for detecting protuberances may be mounted to shuttle 28 so that they move parallel to the z-axis with the shuttle.

It is noted that obstacle detection systems in accordance with embodiments of the invention, such as for example detection systems 302 and 330, can be used not only to detect protuberances in construction layers but also the presence of obstacles on construction platform 24. Such obstacles may, for example, comprise pieces of a first object constructed by an RPA and inadvertently left on the RPA's construction platform that might interfere with production of a second, subsequent object by the RPA.

Optionally, in accordance with an embodiment of the invention, an RPA comprises a collision detection system for detecting if and when the RPA's shuttle collides with an obstacle. Upon occurrence of a collision, controller 26 optionally stops production of an object and generates an alarm to alert a user that a collision has occurred and that his or her intervention is require.

By way of example, RPA 300 shown in FIGS. 12A-12D is shown comprising a collision detection system 340 optionally mounted on shuttle 28. Optionally, collision detection system 340 comprises an accelerometer (not shown) that generates signals responsive to acceleration of shuttle 28. A collision usually generates a force that produces an unwanted shuttle, acceleration having a characteristic profile useable to identify the acceleration as resulting from a collision. For example, a collision in general results in an impulse applied to the shuttle that produces a corresponding identifiable acceleration.

Whereas in FIGS. 12A-12D collision system 340 is shown mounted on shuttle 28, a collision detection system, in accordance with an embodiment of the invention, may be mounted in or on other components of an RPA. For example, a collision detection system may be mounted on a component (not the shuttle) of the RPA to detect vibrations in the component characteristic of those generated by a collision. In some embodiments of the invention, a collision detection system comprises a microphone and associated algorithms for identifying sounds that typically accompany a collision.

Printing resolution of droplets of construction layers dispensed by an RPA (i.e. density of droplets of construction material printed along the x and y directions) and other "operating" parameters that define operating specifications of an RPA are generally complex functions of each other. For example, "waste ratio" is conventionally defined as a ratio of quantity of construction material removed from a printed construction layer by leveling roller 27 (FIG. 1) to an amount of material printed to form the layer. With increase in waste ratio, generally, thickness of a layer decreases, quality of construction increases (resolution of construction in the stacking direction, i.e. z-direction, increases), production speed decreases and cost increases. To provide effective operation of an RPA, values for its operating parameters are determined responsive to their interdependencies. Since, interdependencies of an RPA's operating parameters are generally manifold, it is usually complicated to determine a set of values for the operating parameters that provide for efficient operation of the RPA. Resolution and other operating parameters of an RPA are therefore usually factory set and are not adjustable by a user. As a result, a user has limited flexibility in determining production specifications, hereinafter "object specifications", which define desired qualities and characteristics of an object that the RPA produces.

To provide flexibility and expanded user control of operating parameters of an RPA and thereby of object specifications, in accordance with an embodiment of the invention, the RPA's controller is provided with "RPA" operating algorithms and data. The RPA operating algorithms and data enable a user to adjust an RPA's operating parameters responsive to desired specifications for an object that the RPA produces. The user inputs information to the RPA that defines desired object specifications and the controller adjusts operating parameters of the RPA responsive to the RPA data and algorithms to satisfy the object specifications. If a particular profile of object specifications cannot be met, the controller communicates to the user that they cannot be met and instructs him or her as to which object specification options are available and how to proceed to set an acceptable object specification profile.

Figure 13:
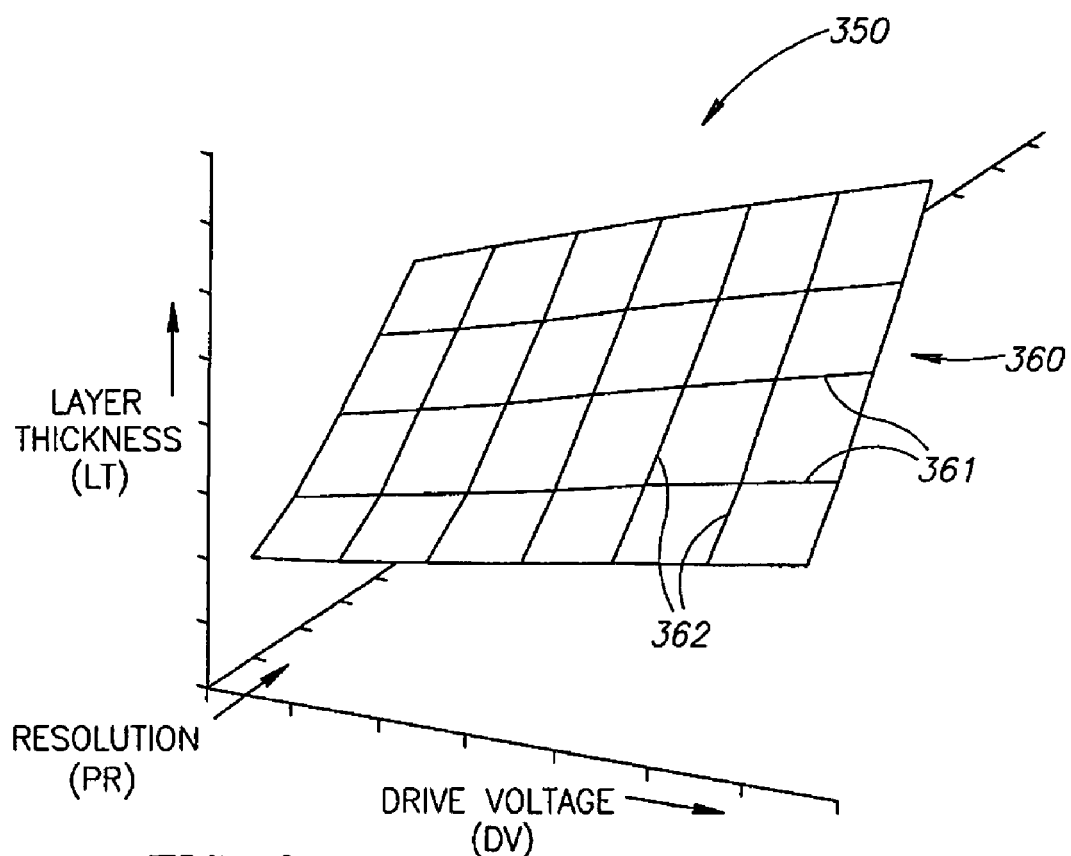
FIG. 13 shows a schematic graph illustrating interdependence of parameters that characterize performance of an RPA, in accordance with an embodiment of the invention.

For example, controller 26 of RPA 20 is optionally provided with data that correlates values for layer thickness (LT), x and/or y-axis printing resolution (PR), and driving voltage (DV) for printing heads 52 that controls volume of droplets of construction material that the printing heads dispense. FIG. 13 shows a schematic graph 350 of RPA data available to controller 26. Graph 350 shows a surface 360 that relates values of layer thickness LT, resolution PR and operating voltage DV for a printing head 52. (Operating data such as that represented by graph 350 may be different for different printing heads. As noted above, in accordance with an embodiment of the invention, such operating data is provided to controller 26 for each printing head 52 by memory 49 comprised in the printing head circuit board 55.) Resolution is assumed measured in units of dpi, dots or droplets of construction material dispensed per inch along the x or y-axis shown, e.g., in FIG. 1, to produce a construction layer. Lines 361 and 362 on surface 360 aid in visualizing the surface and lie in planes parallel respectively to the DV-LT and PR-LY planes in graph 350. Lines 361 and other lines in planes parallel to the DV-LT plane show layer thickness LT as function of drive voltage DV for different constant values of resolution PR. Lines 362 and other lines in surface 360 that are parallel to the PR-LT plane show LT as function of PR for different constant values of DV. When a user specifies a desired construction layer LT and a printing resolution PR, controller 26 determines driving voltage in accordance with an appropriate RPA algorithm responsive to the data represented in graph 350. If there is no driving voltage that provides the specified LT and PR, controller 26 alerts the user to that fact and presents the user with acceptable ranges for LT and RP.

From graph 350 it is seen that for a given driving voltage DV, layer thickness LT of a construction layer in an object produced by an RPA increases as printing resolution PR increases. This is because for a given DV, droplets of construction material dispensed by a printing head 52 comprise substantially a same volume of material and as resolution increases the density of droplets deposited per inch, i.e. dpi, along the x and/or y-axis increases. As a result, more material is deposited per unit surface area of the construction layer and the thickness of the layer increase. However, as thickness of construction layers increase, construction resolution along the z-axis decreases and fidelity of the object produced by the RPA to an article of which the object is a copy is reduced. The effects of surface tension of construction material printed to form a construction layer also reduce fidelity and quality of the produced object. Surface tension of the construction material tends to deform edges of a construction layer and deformation of edges tends to increase with increase in layer thickness.

In accordance with an embodiment of the invention, an object constructed by an RPA that has fidelity and quality provided by relatively high printing resolution along the x and/or y-axis is produced from relatively thin construction layers.

Let x-pitch and y-pitch of a construction layer in the object be the distances between coordinates at which construction material droplets are deposited along the x and y-axes respectively to form the layer. (The x-pitch and y-pitch are the inverses respectively of the x and y printing resolutions.) Layers in the object are printed at relatively low x and/or y printing resolutions (not necessarily the same) and corresponding relatively large x-pitch and/or y-pitch so that the layers are relatively thin and are not as sensitive to surface tension effects as thick layers. However, in accordance with an embodiment of the invention, the x and/or y coordinates at which droplets of construction material are deposited in adjacent construction layers are shifted from each other by a fraction, a "pitch fraction", less than one of the x-pitch and or y-pitch of the droplets. (The pitch fraction in not necessarily the same for both x and y coordinates.)

The inventors have found that fidelity and quality of the object are substantially that of an object constructed from relatively thin layers having "effective" x and/or y resolutions equal to the relatively low resolutions at which the layers are actually printed multiplied by the inverse of the corresponding pitch fraction. Since the pitch fraction is less than one, the effective resolutions are substantially increased.

Figure 14:
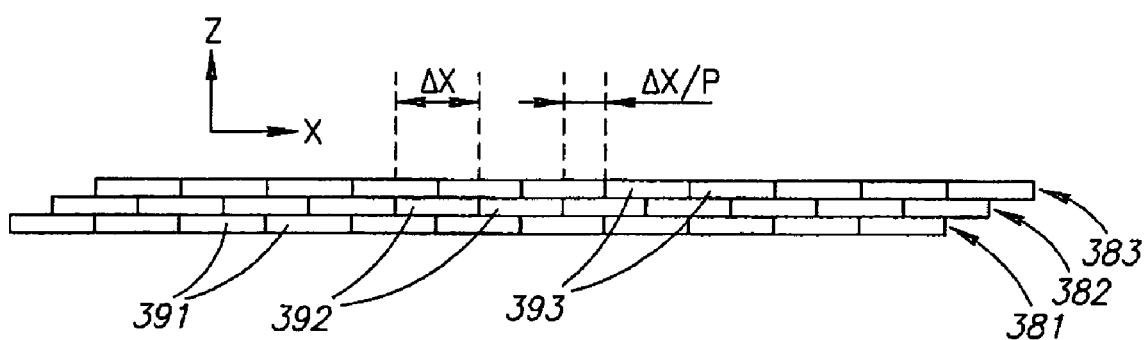
FIG. 14 schematically shows a method of producing a relatively thin construction layer having relatively high printing resolution, in accordance with an embodiment of the present invention.

FIG. 14 schematically illustrates printing layers in accordance with an embodiment of the invention as described above. The figure shows a schematic cross section, by way of example parallel to the xz plane, of construction layers 381, 382, 383 formed by an RPA, in accordance with an embodiment of the invention. Layers 381, 382 and 383 are formed from droplets of construction material 391, 392, and 393 respectively. The droplets are schematically shown after they have melded and been leveled by a leveling roller, such as leveling roller 27 (FIG. 1). The printing configuration of construction layers 381, 382 and 383 is repeated for every three layers thereafter with every third layer having the same x-coordinates.

Layers 381, 382 and 383 are printed at a relatively low resolution of N dpi, along the x-axis and corresponding x-pitch, "$\Delta x$"=1/N inches. Let the pitch fraction be represented by "1/P" where "P" is a number greater than 1. Then the x-coordinates of droplets 391 in an "n-th" row of droplets printed by the RPA are $(x_o+(n-1)\Delta x)$, where $x_o$ is the x-coordinate of a first droplet along the x-axis in layer 381. In accordance with an embodiment of the invention, corresponding x-coordinates of droplets 392 in layer 382 are $(x_o+(n-1)\Delta x+(1/P)\Delta x)$ and corresponding x-coordinates of droplets 393 in layer 383 are optionally $(x_o+(n-1)\Delta x+\Delta x)$.

The x-coordinates of droplets in each layer 381, 382 and 383 correspond to the x-coordinates of homologous voxels defined by the construction data of an object responsive to which the layers are printed. The construction data voxels corresponding to droplets in adjacent layers are displaced relative to each other by a distance corresponding to $(1/P)\Delta x$.

In some embodiments of the invention, the droplets in each layer correspond to homologous voxels in corresponding layers defined responsive to the construction data that are partitioned into voxels having an x-pitch equal to $\Delta x$ and corresponding to "low" printing resolution N. The layers are "thin layers" that have a thickness corresponding to that of construction layers 381, 382 and 383.

In some embodiments of the invention the droplets in all three layers correspond to homologous voxels in a "thick" layer defined responsive to the construction data that has thickness corresponding to that of all three layers combined. The thick "construction data" layer is partitioned into voxels having an x-pitch $(1/P)\Delta x$ that corresponds to the high effective printing resolution (P×N). Droplets 391 in construction layer 381 correspond to those voxels in the construction data layer having x-coordinates corresponding $(x_o+(n-1)\Delta x)$. Droplets 392 and 393 in layers 382 and 383 correspond to those droplets in the construction data layer having x-coordinates corresponding to $(x_o+(n-1)\Delta x+(1/P)\Delta x)$ and $(x_o+(n-1)\Delta x+\Delta x)$ respectively.

The inventors have found that an effective printing resolution for layers 281, 282 and 283 is substantially equal to P×N, corresponding to an effective x pitch equal to $\Delta x/P$. The effective x pitch $\Delta x/P$ for layers 281, 282 and 283 is indicated in FIG. 14.

By way of numerical example, P in FIG. 14 is equal to 2 and the pitch fraction is 0.5. If low printing resolution N is equal to 600 dpi along the x-axis and corresponding x pitch ⅟₆₀₀ in., then an effective printing resolution along the x-axis for the layer is 2×600=1200 dpi and a corresponding high resolution x pitch is equal to ⅟₁₂₀₀ in.

An RPA production facility for producing objects comprises one or more of RPAs that define and provide a limited production capacity. As requests to produce objects are received by the facility, the facility must determine how to allocate and schedule its production capacity to meet the demand. Each request for production defines at least one object to be produced in accordance with a set of object specifications that defines a set of RPA operating parameters (e.g. resolution, layer thickness, waste ratio, production time . . . ) that is often different from that of other production requests. Allocating and scheduling production capacity is therefore in general complicated and frequently requires a production manager aided by appropriate computer programs to oversee and implement job scheduling.

In accordance with an embodiment of the invention, allocation and scheduling of production capacity of an RPA facility is performed by a job management algorithm (JMA) that interfaces directly with a user and allocates and schedules production capacity, optionally, without intervention of a production manager.

When a user wants to place an order with the facility for a production job, the user accesses the JMA. The JMA in response presents the user, optionally on a computer screen using a suitable GUI, a plurality of virtual construction platforms. Each virtual construction platform represents a construction platform, such as construction platform 24 shown in FIG. 1 on which an RPA of the RPA production facility constructs objects ordered from the facility.

Each virtual construction platform is characterized by a plurality of "platform parameters". The platform parameters define, by way of example, an estimated time at which production of objects on the platform is scheduled to begin and optionally end, available production space on the platform and cost of the space. Optionally, platform parameters comprise RPA operating parameters, such as layer thickness, resolution and waste ratio, in accordance with which, the RPA facility will produce objects on the platform.

The user chooses a platform having sufficient available space for the object that the user wants to produce, RPA operating parameters that correspond to the production job's object specifications and that provides him or her with suitable scheduling and cost. Once the user completes the process of choosing a platform, the user satisfies administrative requirements, such as arranging for payment or endorsing a purchase order, to finalize and reserve production space and time he or she has ordered.

In some embodiments of the invention, a user may define at least some platform parameters of a platform. For example, the JMA optionally presents the user with at least one "empty" construction platform for which the user can define platform parameters. Optionally, a platform parameter that the user can define comprises a priority, which, if set high enough, may enable the user's job to be produced out of turn, before other previously scheduled jobs. The JMA in response to platform parameters defied by the user optionally generates a corresponding cost of production space on the platform. For example, if the user sets a very high priority for a platform that preempts scheduling of other jobs the JMA determines cost of space on the platform accordingly.

In many situations, the user will not be in a position to conveniently determine RPA operating parameters, platform space, cost and other parameters, hereinafter "job data" needed to execute the user's job. For such cases, optionally the JMA offers the user a production wizard that aids the user in determining job data. Optionally, the wizard aids the user via an interactive interrogation session in which the wizard presents the user with questions whose answers are used to determine job data. Optionally, the user transmits construction data that define the object that the user wants to produce and the wizard determines job data from the transmitted construction data. Once job data is defined, the wizard may highlight or otherwise indicate, which of a plurality of production platforms are suitable for the user's job.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

The invention claimed is:

1. An apparatus for producing an object by sequentially forming thin layers of a material one on top of the other responsive to data defining the object, the apparatus comprising:
   at least one printing head controllable to dispense a material in liquid form;
   a lamp controllable to provide radiation to irradiate the material; and
   a controller operative to control the printing head to dispense the material and sequentially form the layers and the lamp to irradiate the dispensed material;
      wherein the lamp comprises an array of LEDs controllable to provide the radiation and wherein the controller is operative to operate at any time during production of the object, a first portion of the LEDs of the array at a higher radiation intensity than a second portion of the LEDs of the array.

2. The apparatus according to claim 1 wherein the controller is operative to switch the LEDs in the array on and off during irradiation of the material.

3. The apparatus according to claim 1, wherein the controller is operative to selectively turn off a portion of the LEDs of the array.

4. The apparatus according to claim 1 wherein the controller is operative to control intensities of some of the LEDs in the array independently of intensities of other LEDs in the array.

5. The apparatus according to claim 4, wherein the controller is operative to control intensities of UV light irradiated by the LEDs.

6. The apparatus according to claim 1, wherein the LEDs in the array irradiate at a selected wavelength.

7. The apparatus according to claim 1 wherein the controller is operative to control a current or voltage supplied to the LEDs.

8. The apparatus according to claim 1 wherein the controller is operative to control a duty cycle of pulses of current or voltage supplied to the LEDs.

9. The apparatus according to claim 1 comprising a microlens operative to configure light from the LED into a cone beam of radiation.

10. The apparatus according to claim 9 wherein the cone angle is 80° or larger.

11. The apparatus according to claim 1 comprising radiation conductors operative to pipe radiation from a location of the LEDs to a location more proximal to a region of a layer to be irradiated.

12. The apparatus according to claim 1, wherein a substantial portion of radiation provided by the lamp is directed so that it is incident at a substantially non-normal angle on the layers.

13. The apparatus according to claim 1, wherein the LEDs are in a form of a semiconductor die.

14. The apparatus according to claim 13, wherein the LEDs are arrayed at a pitch of 2 mm or less.

15. The apparatus according to claim 13, wherein the LEDs are arrayed at a pitch of 1 mm or less.

16. The apparatus according to claim 1, wherein the material is a photopolymer material.

17. A method for producing an object by sequentially forming thin layers of material one on top of the other responsive to data defining the object, the method comprising:
dispensing a material in liquid form with at least one printing head;
irradiating the material with an array of LEDs;
controlling the irradiation of the array of LEDs during the producing; and
controlling the dispensing to sequentially form the layers, wherein controlling the irradiation of the array of LEDs includes operating at any time during the production a first portion of the LEDs of the array at a higher radiation intensity than a second portion of the LEDs of the array.

18. The method according to claim 17 wherein controlling the irradiation of the array of LEDs includes on/off switching of the LEDs in the array, during the production.

19. The method according to claim 17, wherein controlling the irradiation of the array of LEDs includes selectively turning off a portion of the LEDs of the array.

20. The method according to claim 17, wherein controlling the irradiation of the array of LEDs includes controlling intensities of some LEDs in the array independently of intensities of other LEDs in the array.

21. The method according to claim 20, wherein controlling the irradiation of the array of LEDs includes controlling intensities of UV light irradiated by the LEDs.

22. The method according to claim 17, wherein the LEDs in the array irradiate at a selected wavelength.

23. The method according to claim 17 wherein the second portion of the LEDs is directed at a non-printed region of a layer.

24. The method according to claim 17 comprising turning off the second portion of the LEDs.

25. The method according to claim 17 comprising controlling a current or voltage supplied to the LEDs.

26. The method according to claim 17 comprising controlling a duty cycle of pulses of current or voltage supplied to the LEDs.

27. The method according to claim 17 comprising configuring light from the LED into a cone beam of radiation.

28. The method according to claim 27 wherein the cone angle is 80° or larger.

29. The method according to claim 17 comprising directing radiation from the LEDs to a location proximal to a region of a layer to be irradiated.

30. The method according to claim 17, wherein a substantial portion of radiation provided by the LEDs is directed so that it is incident at a substantially non-normal angle on the layers.

31. The method according to claim 17, wherein the LEDs are arrayed at a pitch of 2 mm or less.

32. The method according to claim 17, wherein the LEDs are arrayed at a pitch of 1 mm or less.

33. The method according to claim 17, wherein the material is a photopolymer material.

34. An apparatus for producing an object by sequentially forming thin layers of a material one on top of the other responsive to data defining the object, the apparatus comprising:
at least one printing head controllable to dispense a material in liquid form;
a lamp controllable to provide radiation to irradiate the material; and
a controller operative to control the printing head to dispense the material and sequentially form the layers and the lamp to irradiate the dispensed material;
wherein the lamp comprises an array of LEDs controllable to provide the radiation and wherein the controller is operative to alter operation of at least a portion of the LEDs during production of the object so that a first portion of the LEDs of the array is radiated at a higher radiation intensity than a second portion of the LEDs of the array.

35. The apparatus according to claim 34, wherein the controller is operative to selectively turn off a portion of the LEDs of the array.

36. The apparatus according to claim 34 wherein the controller is operative to control intensities of some of the LEDs in the array independently of intensities of other LEDs in the array.

37. A method for producing an object by sequentially forming thin layers of material one on top of the other responsive to data defining the object, the method comprising:
dispensing a material in liquid form with at least one printing head;
irradiating the material with an array of LEDs;
controlling the irradiation of the array of LEDs during the producing; and
controlling the dispensing to sequentially form the layers, wherein controlling the irradiation of the array of LEDs includes altering operation of at least a portion of the LEDs during the production of the object so that a first portion of the LEDs of the array is radiated at a higher radiation intensity than a second portion of the LEDs of the array.

38. The method according to claim 37, wherein controlling the irradiation of the array of LEDs includes selectively turning off a portion of the LEDs of the array.

39. The method according to claim 37, wherein controlling the irradiation of the array of LEDs includes controlling intensities of some LEDs in the array independently of intensities of other LEDs in the array.

40. The method according to claim 37, wherein the second portion of the LEDs is directed at a non-printed region of a layer.

* * * * *